(12) United States Patent
Kar et al.

(10) Patent No.: US 9,601,902 B2
(45) Date of Patent: Mar. 21, 2017

(54) OPTICAL SIGNAL AMPLIFICATION

(71) Applicant: University of Central Florida Research Foundation, Inc., Orlando, FL (US)

(72) Inventors: Aravinda Kar, Oviedo, FL (US); Tariq Manzur, Newport, RI (US)

(73) Assignees: University of Central Florida Research Foundation, Inc., Orlando, FL (US); United States of America, Newport, RI (US)

( * ) Notice: Subject to any disclaimer, the term of this patent is extended or adjusted under 35 U.S.C. 154(b) by 298 days.

(21) Appl. No.: 14/307,057

(22) Filed: Jun. 17, 2014

(65) Prior Publication Data

US 2015/0098481 A1  Apr. 9, 2015

Related U.S. Application Data

(63) Continuation of application No. 12/964,072, filed on Dec. 9, 2010, now abandoned.

(Continued)

(51) Int. Cl.
*H01S 5/00* (2006.01)
*H01S 5/026* (2006.01)
*B82Y 20/00* (2011.01)
*G01J 1/42* (2006.01)
*H01L 21/223* (2006.01)

(Continued)

(52) U.S. Cl.
CPC ............ *H01S 5/0264* (2013.01); *B82Y 20/00* (2013.01); *G01J 1/42* (2013.01); *H01L 21/223* (2013.01);

(Continued)

(58) Field of Classification Search
CPC ...... H01S 5/0028; H01S 5/183; H01S 5/0264; H01S 5/0262; H01S 5/426
(Continued)

(56) References Cited

U.S. PATENT DOCUMENTS 5,101,293 A * 3/1992 Kemeny ................. H01S 5/183
359/254
6,069,905 A * 5/2000 Davis ................... G02B 6/4204
372/103

(Continued)

OTHER PUBLICATIONS

Tariq Manzur, et al., "Infrared imaging at high temperatures", SPIE, Dec. 27, 2012, pp. 1-3.
(Continued)

*Primary Examiner* — Mark Hellner
(74) *Attorney, Agent, or Firm* — Jetter & Associates, P.A.

(57) ABSTRACT

A method of optical signal amplification. Incident photons are received at a photodetector including a doped semiconductor biased by a power source. The photons generate a change in a reflective property, refractive index, or electrical conductivity of the doped semiconductor. For the change in reflective property or refractive index, a first optical signal is reflected off the photodetector to provide a reflected beam, or the photodetector includes a reverse biased semiconductor junction including the doped semiconductor within a laser resonator including a laser medium, wherein a second optical signal is emitted. For the change in electrical conductivity the photodetector includes a reversed biased semiconductor junction that is within an electrical circuit along with an electrically driven light emitting device, where a drive current provided to the light emitting device increases as the electrical conductivity of the photodetector decreases, and the light emitting device emits a third optical signal.

8 Claims, 17 Drawing Sheets

Related U.S. Application Data

(60) Provisional application No. 61/378,498, filed on Aug. 31, 2010.

(51) Int. Cl.
*H01L 21/268* (2006.01)
*H01L 27/146* (2006.01)
*H01S 5/183* (2006.01)
*H01S 5/343* (2006.01)
*H01S 5/42* (2006.01)

(52) U.S. Cl.
CPC ........ *H01L 21/2233* (2013.01); *H01L 21/268* (2013.01); *H01L 27/14643* (2013.01); *H01S 5/0028* (2013.01); *H01S 5/183* (2013.01); *H01S 5/0262* (2013.01); *H01S 5/34306* (2013.01); *H01S 5/426* (2013.01)

(58) Field of Classification Search
USPC ........................................................ 359/344
See application file for complete search history.

(56) References Cited

U.S. PATENT DOCUMENTS

| | | |
|---|---|---|
| 6,153,874 A | 11/2000 | Monoi |
| 7,505,688 B2 * | 3/2009 | Guenter ............... H04B 10/806 398/135 |
| 8,409,909 B2 | 4/2013 | Nagaraja |
| 2005/0127463 A1 | 6/2005 | Yaung et al. |
| 2006/0138434 A1 * | 6/2006 | Summers .............. H01L 31/107 257/84 |
| 2006/0148194 A1 | 7/2006 | Lim |
| 2011/0159635 A1 | 6/2011 | Doan et al. |
| 2012/0051378 A1 | 3/2012 | Kar et al. |
| 2012/0236297 A1 | 9/2012 | Uematsu et al. |
| 2013/0264469 A1 | 10/2013 | Kikuchi |

OTHER PUBLICATIONS

Geunsik Lim, et al., "Laser fabrication of silicon carbide detector for gas sensing and focal plane array imaging", Proc. of SPIE, vol. 7480, 74800Y, 2009, pp. 1-9.

Geunsik Lim, et al., "MWIR room temperature photodetector based on laser-doped silicon carbide", Proc. of SPIE, vol. 7833, 78330U-1, 2010, pp. 1-10.

Geunsik Lim, et al., "Optical response of laser-doped silicon carbide for an uncooled midwave infrared detector", Applied Optics, vol. 50, No. 17, Jun. 10, 2011, pp. 2640-2653.

Sachin Bet, et al., "Laser-doping of silicon carbide for p-n junction and LED fabrication", phys. stat. sol. (a), vol. 204, Issue 4, Apr. 2007, pp. 1147-1157.

\* cited by examiner

OPTICAL SIGNAL AMPLIFICATION

CROSS-REFERENCE TO RELATED APPLICATION

This application is a continuation application which claims the benefit of application Ser. No. 12/964,072 entitled "PHOTODETECTION" filed on Dec. 9, 2010, which claims the benefit of Provisional Application Ser. No. 61/378,498 entitled "FREQUENCY-TUNED DETECTORS COUPLED WITH OPTICAL AMPLIFIERS FOR WEAK SIGNAL DETECTION", filed Aug. 31, 2010, which are both herein incorporated by reference in their entireties.

STATEMENT REGARDING FEDERALLY SPONSORED RESEARCH

This disclosure was made with United States Government support under Contract Number N66604-09-M-3087 awarded by the Naval Undersea Warfare Center. The United States Government has certain rights in this invention.

FIELD

This disclosure is related to optical amplifiers and methods of optical amplification.

BACKGROUND

In general, remote sensing technologies use one of the following techniques: a) a battery-powered sensor/detector and transmitter, b) a remotely radio-frequency (RF) powered sensor/detector and transmitter, and c) a wave guide-delivered optical signal that produces a reflected signal back to a sensor/detector where the signal can be used for analysis. The latter technique is often used in one of two ways. The first method is where the optical signal is used in conjunction with a fiber optic wave guide where changes in the index of refraction of the waveguide can be used to determine environmental factors such as temperature of fiber or the mechanical force being applied to the fiber. The second approach requires the fiber to collect a light from the radiation source and/or reflected signal from the fiber and deliver the captured light back to a sensor or detector for analysis. The analysis is accomplished by a sophisticated computer system that deconvolves the spectral components of the reflected light and/or any changes in intensity resulting from an index of refraction modulation. These effects can often happen simultaneously making difficult to detect and/or measure the desired effects.

SUMMARY

Disclosed embodiments provide systems, devices, and methods for optical amplification. For example, briefly described, in one embodiment among others, a sensor comprises an array of photodetectors, wherein the reflectance of each of the photodetectors is a function of the number of photons incident on the respective photodetector; and an electrical insulator is positioned between one of the photodetectors and another one of the photodetectors to reduce diffusion of electrons therebetween.

This Disclosure also provides methods for sensing photons. In this regard, one embodiment of such a method, among others, can be broadly summarized by the following steps: reflecting a portion of an optical beam such as a laser beam off a photodetector including at least one doped semiconductor, and absorbing photons incident upon the photodetector, thereby increasing a carrier concentration of the doped semiconductor. The method further comprises the step of reflecting a greater portion of the laser beam using the photodetector responsive to the absorption of the photons.

This Disclosure also provides embodiments including a laser resonator. In this regard, one embodiment of such a laser resonator, among others, can be broadly summarized as comprising a reflective mirror and a photodetector including at least one doped semiconductor positioned opposite the reflective mirror. The laser resonator further comprises a lasing medium positioned between the reflective mirror and the photodetector. The reflectance of the doped semiconductor can be a function of the number of photons absorbed by the doped semiconductor, and an intensity of a laser beam emitted by the laser resonator is a function of the reflectance of the doped semiconductor.

This Disclosure also provides methods for laser doping an intrinsic semiconducting material. In this regard, one embodiment of such a method, among others, can be broadly summarized by the following steps: providing a semiconducting material having a lattice, and transmitting a laser beam to the semiconducting material in the presence of a dopant carrying gas carrying a dopant. The laser beam driving the dopant into the lattice of the semiconducting material.

This Disclosure also provides methods for fabricating a vertical cavity surface emitting laser (VCSEL). In this regard, one embodiment of such a method, among others, can be broadly summarized by the following steps: providing an intrinsic semiconducting material having a top surface and a bottom surface; doping the intrinsic semiconducting material to form a photodetector; depositing at least one epilayer on the top surface of the doped intrinsic semiconducting material; depositing a quantum well layer on the at least one epilayer; depositing a buffer layer on the quantum well layer; forming a pattern layer on the bottom surface of the intrinsic semiconducting material; and wet etching the intrinsic semiconducting material according to the pattern layer. The at least one epilayer provides an etch stop for wet etching the intrinsic semiconducting material, and the wet etching forms a cavity. The method further comprises depositing a distributed Bragg reflector layer in the cavity, and depositing an optically-transparent conductive film on the distributed Bragg reflector layer to form a p-side contact.

Other systems, methods, features, and advantages of disclosed embodiments will be or become apparent to one with skill in the art upon examination of the following drawings and detailed description. It is intended that all such additional systems, methods, features, and advantages be included within this description, be within the scope of this Disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

This Disclosure generally relates to systems, devices, and methods for optical signal amplification. Various embodiments describe photodetectors that are wireless optical output photodetectors (i.e., optical signal-based photodetectors) as opposed to conventional photodetectors that are electrical signal output photodetectors (i.e., an electrical photodetector). For example, in some embodiments, a photodetector detects incident photons by absorbing the photons, which modulates the index of refraction and reflectivity of the semiconductor of the photodetector. The change in the index of refraction and the reflectivity of the semiconductor can be monitored externally without any other active elements on the photodetector. Examples of structure, materials, and configurations of various embodiments of will be discussed below followed by a description of the fabrication and operation of the same.

Figure 1:
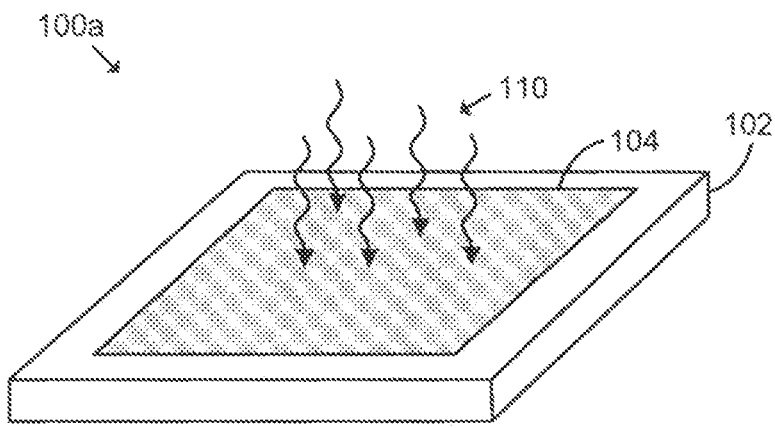
FIG. 1 is a block diagram that illustrates an embodiment of a sensor.

FIG. 1 is a block diagram illustrating one embodiment, among others, of a sensor 100, denoted herein as 100a. The sensor 100a, includes a photodetector 104, which includes a doped region of an intrinsic semiconductor material 102. The doped region may be p-doped or n-doped. In other embodiments, which will be discussed in further detail below, the sensor 100 may include an array of photodetectors 104. A photodetector 104 absorbs at least some of the photons 110 incident upon the photodetector 104, which alters the carrier concentration of the photodetector 104. The change in the carrier concentration results in a change in the index of refraction and the reflectivity of the photodetector 104. The level of doping affects the absorption level of the photodetector 104 as well as the amount of change in reflectivity. Various other embodiments of sensors 100 including at least one photodetector 104 which will be discussed in further detail below.

Figure 2:
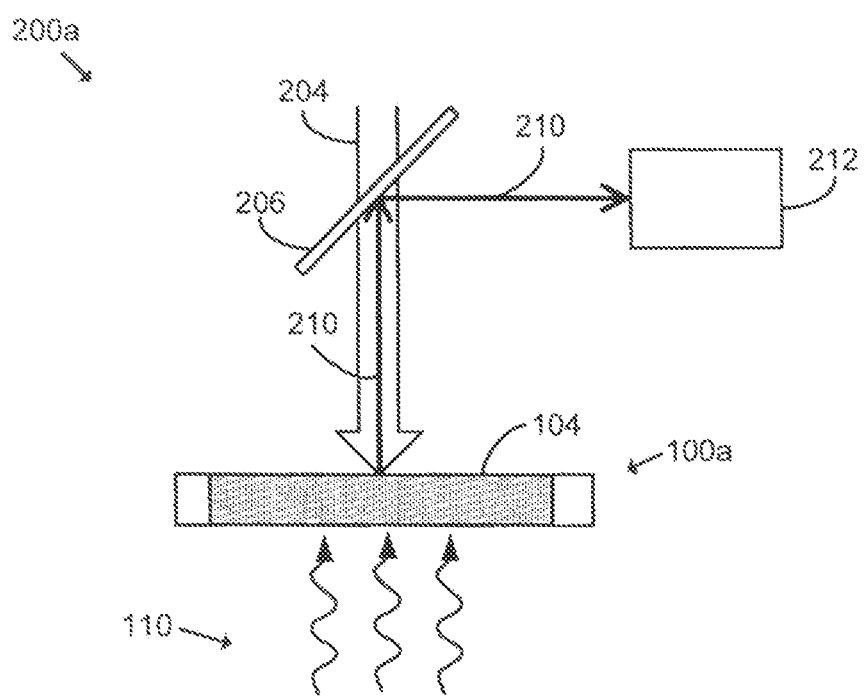
FIG. 2 is a block diagram that illustrates an embodiment of a system for measuring the reflectivity of a sensor.

FIG. 2 is a block diagram illustrating one embodiment, among others, of a system 200 for measuring the reflectivity of a sensor 100. Specifically, the system 200, denoted herein as 200a, is for measuring the reflectivity of the photodetector 104 included within a sensor 100 and, thus, photons 110 incident upon the photodetector 104. In the embodiment illustrated in FIG. 2, the sensor 100 measured is the sensor 100a illustrated in FIG. 1. A laser beam 204, such as a helium-neon (He—Ne) laser beam, passes through a beam splitter 206 and is incident upon the photodetector 104. The laser beam 204 is reflected by the photodetector 104 back up to the beam splitter 206, which reflects and redirects the laser beam 204 to a power meter 212, denoted herein as reflected laser beam 210.

Figure 3:
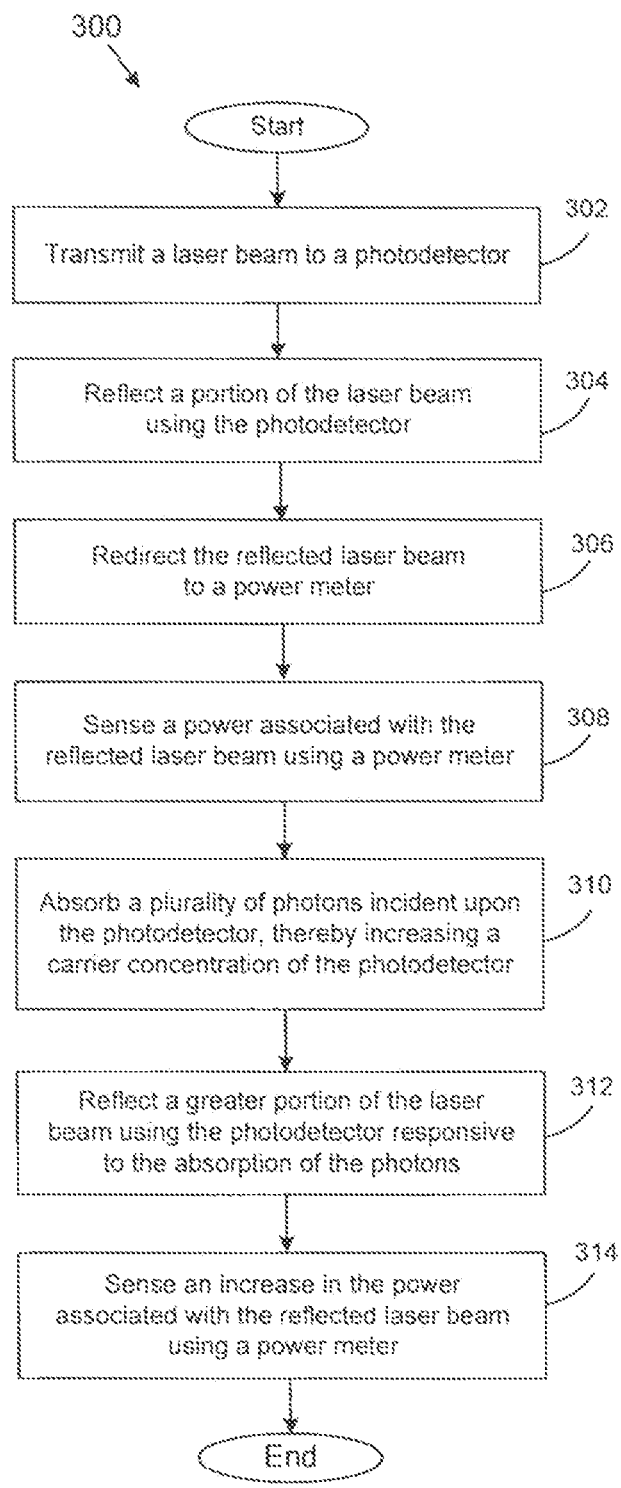
FIG. 3 is a flowchart showing an example of a method of measuring the reflectivity of a sensor using the embodiment of the system illustrated in FIG. 2.

FIG. 3 is a flowchart showing an example of a method 300 of measuring the reflectivity of a sensor 100 using the embodiment of the system 200a illustrated in FIG. 2. In box 302, a laser beam 204 is transmitted to a photodetector 104. In some embodiments, such as the one illustrated in FIG. 2, the laser beam 204 is transmitted through a beam splitter 206. In box 304, a portion of the laser beam 204 is reflected by the photodetector 104. The reflected portion of the laser beam 204 is shown as reflected laser beam 210 in the example illustrated in FIG. 2. In box 306, the reflected laser beam 210 is redirected to a power meter 212 by the beam splitter 206.

In box 308, the power meter 212 senses a power associated with the reflected laser beam 210. In box 310, a plurality of photons 110 that are incident upon the photodetector 104 are absorbed by the photodetector 104. Not all photons 110 that are incident on the photodetector 104 are absorbed. Only the photons 110 having a wavelength (or frequency) that corresponds to bandgap of the photodetector 104 are absorbed, which will be discussed in further detail below. The absorption of photons 110 by the photodetector 104 increases the carrier concentration of the photodetector 104.

In box 312, a greater portion of the laser beam 204 is reflected by the photodetector 104 responsive to the absorption of the photons 110. In box 314, an increase in the power associated with the reflected laser beam 210 is sensed by the power meter 212. Accordingly, subtle changes in reflectivity due to a small number of photons 110 incident upon the photodetector 104 can be detected. In some embodiments, the system 200a may be configured to measure the reflectivity of each photodetector 104 in an array of photodetectors 104.

Having generally described the structure and measurement of the reflectivity of an embodiment of a sensor 100, examples of materials of various embodiments of a sensor 100 will now be discussed. Referring to FIG. 1, the intrinsic semiconducting material 102 may be silicon carbide (SiC), gallium nitride (GaN), silicon (Si), gallium arsenide (GaAs), and/or another intrinsic semiconductor material. Further, the intrinsic semiconducting material 102 may be doped with gallium (Ga), boron (B), aluminum (Al), indium (In), thallium (Tl), and/or another p-type dopant. Doping provides a specific wavelength sensitivity based on the dopant selected, and doping also creates a region of high electron mobility in the photodetector 104 relative to the intrinsic semiconducting material 102. In some embodiments, the intrinsic semiconducting material 102 may be doped with multiple p-type dopants.

Figure 4:
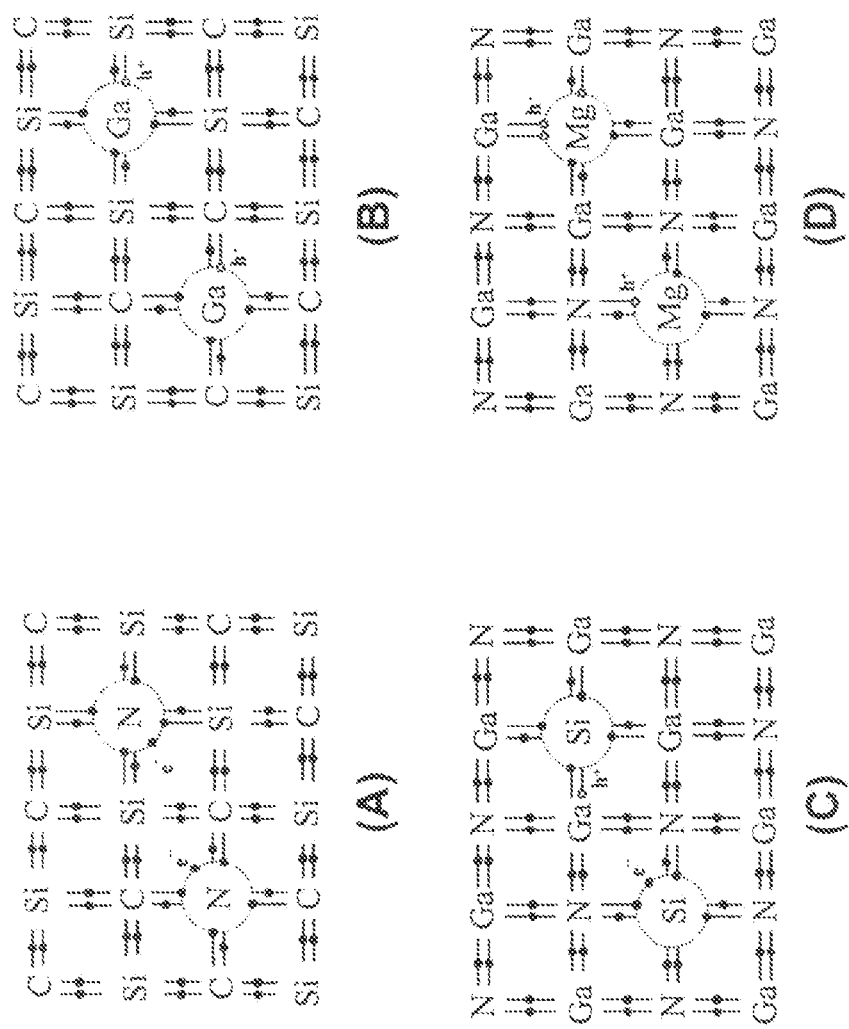
FIG. 4 includes four diagrams (A, B, C, and D) of semiconductor lattices that illustrate various differences between doped silicon carbide (SiC) and doped gallium nitride (GaN).

In some embodiments, SiC may be preferable to GaN as the intrinsic semiconducting material 102 for several reasons, which will be discussed in the following paragraphs. For example, SiC may be preferable as the intrinsic semiconducting material 102 because SiC forms covalent bonds with the dopants instead of polar bonds. FIG. 4 includes four diagrams (A, B, C, and D) of semiconductor lattices that illustrate the differences between doped SiC and doped GaN. Beginning with FIG. 4(A), shown is a diagram of an example of a SiC lattice doped with nitrogen (N). N creates n-type doping in both silicon (Si) and carbon (C) lattice sites. Next, in FIG. 4(B), shown is a diagram of an example of a SiC lattice doped with gallium (Ga). Ga creates p-type doping in both Si and C lattice sites. Since SiC forms covalent bonds, SiC allows n-type or p-type doping regardless of whether the dopant atoms occupy the Si or C sites in the SiC lattice.

In contrast, for example, GaN is a less ideal intrinsic semiconducting material 102 than SiC for creating a sensor 100 because the polar bonds in GaN cause ambiguous n-type or p-type doping depending on whether the dopant atoms occupy the Ga or N sites in the GaN lattice. For example, in FIG. 4(C), shown is a diagram of a GaN lattice doped with Si. As can be seen in FIG. 4(C), the Si atom in a Ga site in the GaN lattice contributes an electron and provides n-type doping whereas the Si in the N site in the GaN lattice contributes a hole and, thus, provides p-type doping. Accordingly, doping a GaN lattice with Si results in ambiguous doping since the Si may contribute either a hole or an electron. Similarly, in FIG. 4(D), shown is a diagram of an example of a GaN lattice doped with magnesium (Mg). As can be seen in FIG. 4(D), the Mg atom in a Ga site in the GaN lattice contributes a hole and provides p-type doping, but the Mg atom in a nitrogen (N) site in the GaN lattice contributes three holes per dopant atom. The Mg atom in the N site can act as a trap or a nonradiative recombination center.

Another reason that SiC may be preferable as the intrinsic semiconducting material 102 for the photodetector 104 over GaN is because of the low ionization of acceptors in GaN. Specifically, when GaN is doped with Mg, less than 10% of the Mg atoms are expected to ionize in GaN. So, for GaN, the concentration of Mg would have to be about two orders of magnitude larger than a desired hole concentration.

As still another reason that SiC may be preferable as the intrinsic semiconducting material 102 over GaN is because manufacturing SiC is easier. For example, single crystal SiC wafers are available in large diameters (e.g., 3"-4"). Additionally, focal plane arrays and other devices can also be built on a single SiC chip. Moreover, although GaN is available in polycrystalline thin films, thin GaN films often contain numerous defects that can act as thermal absorbers in the infrared (IR) and mid-wave infrared (MWIR) ranges. Also, although SiC crystals tend to have micropipe and dislocation defects, the number of these defects per unit area has been reduced significantly by improvements in crystal growth processes.

Additionally, for embodiments of the sensor 100 including an array of photodetectors 104, SiC may be preferable as the intrinsic semiconducting material 102 because electrons and holes have lower mobility and diffusion coefficients in SiC than other intrinsic semiconductor materials 102. Consequently, the loss of signal due to diffusion of electrons to neighboring photodetectors 104 in an array is lower when the lattice material is SiC instead of GaN, Si, and/or gallium arsenide (GaAs). Such loss of signal may reduce the contrast of an image. The level of doping affects the absorption level of the frequency of light from a radiation source and the subsequent amplitude of free carriers and the amount of change in reflectivity.

Figure 5A:
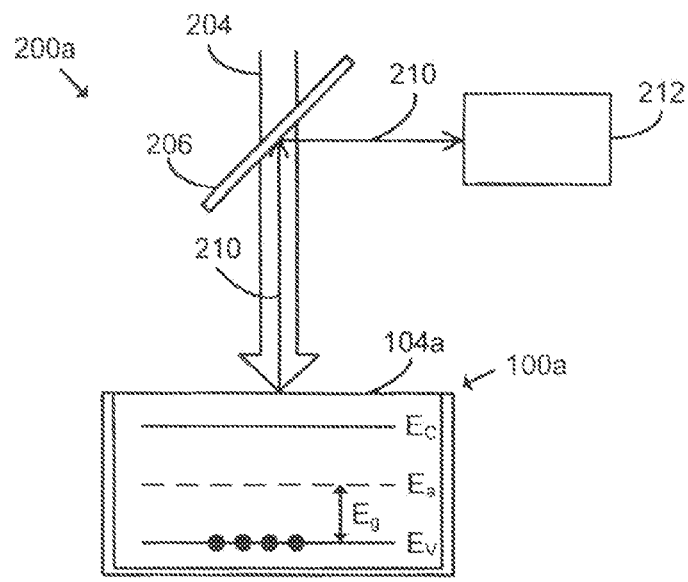
FIGS. 5A-5D, 6A-6C are block diagrams illustrating the system of FIG. 2 measuring the reflectivity of various embodiments of a sensor.

Having generally described the structure and materials of an embodiment of a sensor 100, the mechanism within the photodetector 104 resulting in photodetection will be discussed in connection with FIGS. 5A-5D, 6A-6C. FIG. 5A is a block diagram illustrating an example of the system 200a for measuring the reflectivity of a photodetector 104 included within a sensor 100, similar to the system illustrated in FIG. 2. As in FIG. 2, the example of a sensor 100, denoted as 100a, is illustrated as being measured by the system 200a. Also, similar to the system 200a of FIG. 2, the system 200a illustrated in FIG. 5A reflects and redirects the incident laser beam 204 as shown by the reflected laser beam 210.

However, in the embodiment illustrated in FIG. 5A, the sensor 100a includes an example of an energy band diagram corresponding to an example of a photodetector 104, denoted herein as 104a. The energy band diagram of the photodetector 104a includes a valence band ($E_V$), a conduction band ($E_C$), and an acceptor band ($E_a$), which is an energy band associated with an acceptor (i.e., p-type) dopant. The energy gap ($E_g$) is determined by $E_a$ and $E_V$, and hence the selection of the acceptor dopant for the intrinsic semiconducting material 102. As discussed above, in some embodiments, the sensor 100 is a Ga-doped SiC, and in those embodiments, the energy band level is determined by Ga.

Figure 5B:
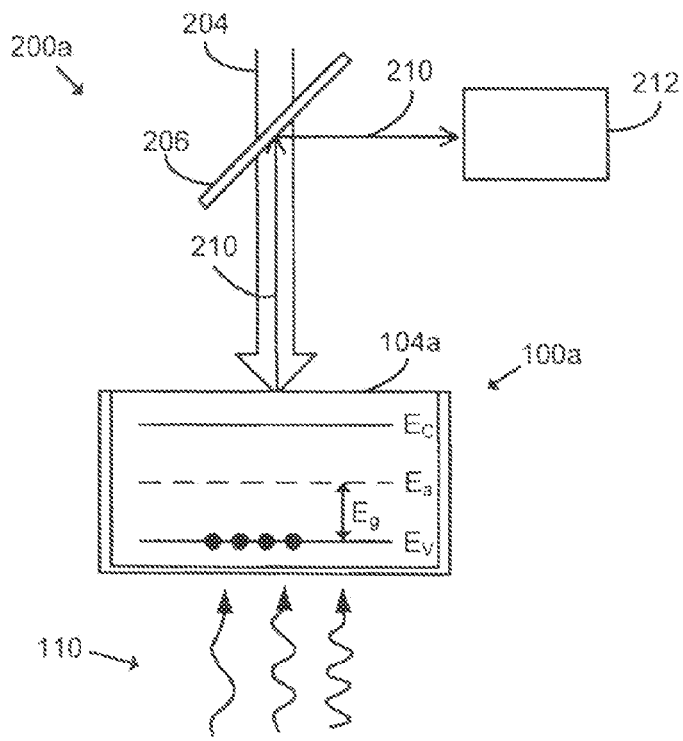

FIG. 5B is another block diagram illustrating the example of the system 200a shown in FIG. 5A including photons 110 incident upon the sensor 100a. Since the wavelengths associated with the photons 110 do not correspond to the energy gap $E_g$, the photons 110 are not absorbed the photodetector 104a and, thus, not detected. Further, the reflectivity of the photodetector 104a remains unchanged, and the intensity of the reflected laser beam 210 remains unchanged as well.

Figure 5C:
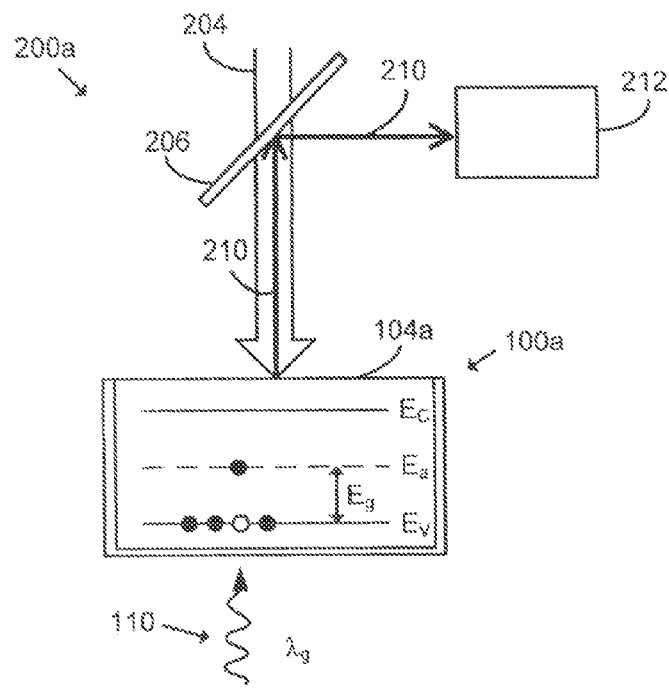

FIG. 5C is yet another block diagram illustrating the example of the system 200a shown in FIG. 5A including a photon 110 incident upon the sensor 100a. However, in FIG. 5C, the incident photon 110 has a wavelength $\lambda_g$ that corresponds to the energy gap $E_g$, and the photodetector 104a absorbs the photon 110, causing an electron to be promoted from the valence band $E_V$ to the acceptor band $E_a$. The promotion provides an increase in holes, which alters the carrier concentration of the photodetector 104a. The change in carrier concentration, in this example, increases the reflectivity of the photodetector 104a, causing the intensity of the reflected laser beam 210 to increase. This increase is then detectable by the power meter 212. Accordingly, a photodetector 104a may be tuned to detect photons 110 having a particular frequency, which is a function of the wavelength and the speed of light, based at least in part on the dopant.

Figure 5D:
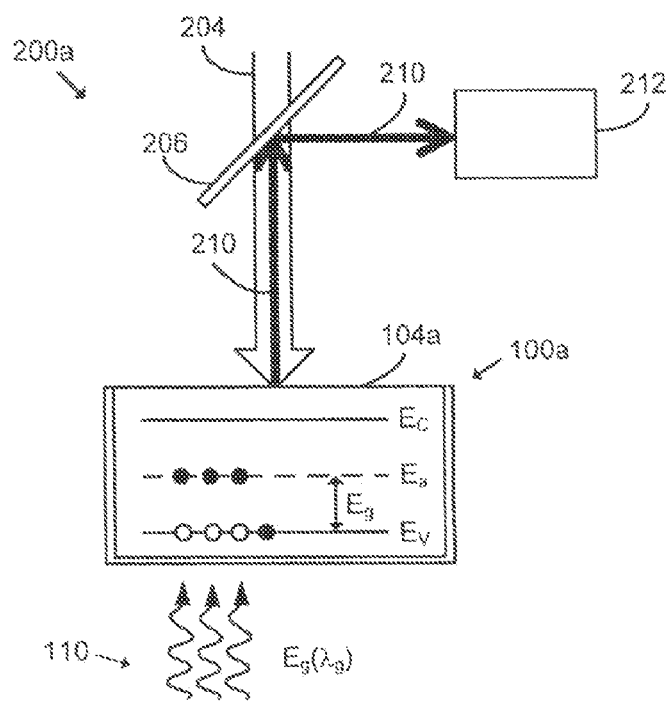

FIG. 5D is still another block diagram illustrating the example of the system 200a shown in FIG. 5A including photons 110 having wavelength $\lambda_g$ incident upon the sensor 100a. Since more photons 110 are absorbed than illustrated in FIG. 5C, the intensity of the reflected laser beam 210 is further increased. Accordingly, since the intensity of the reflected laser beam 210 is directly correlated with the number of incident photons 110, the system 200a is sensitive to how many photons 110 are incident upon the photodetector 104a.

Figure 6A:
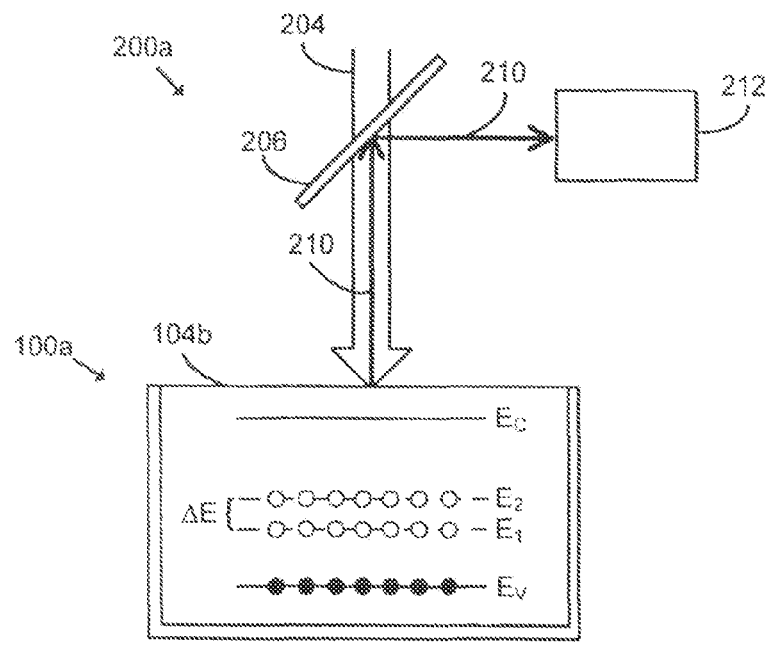

Turning now to FIG. 6A, shown is a block diagram illustrating an example of the system 200a for measuring the reflectivity of a photodetector 104 included within a sensor 100, similar to the system illustrated in FIG. 2. Similar to FIG. 2, the example of a sensor 100, denoted as 100a, is illustrated as being measured by the system 200a. Also, similar to the system 200a of FIG. 2, the system 200a illustrated in FIG. 5A reflects and redirects the incident laser beam 204 as shown by the reflected laser beam 210.

However, in the embodiment illustrated in FIG. 6A, the sensor 100a includes an example of an energy band diagram corresponding to an example of a photodetector 104, denoted herein as 104b. Similar to the energy band diagram of the photodetector 104a illustrated in FIGS. 5A-5D, the energy band diagram of the photodetector 104b includes a valence band ($E_V$) and a conduction band ($E_C$). However, the energy band diagram of photodetector 104b also includes multiple energy bands $E_1$, $E_2$ associated with various dopants. Additionally, an energy difference $\Delta E$ is defined by the energy bands $E_1$, $E_2$.

As an example, in some embodiments, the sensor 100 includes SiC as the intrinsic semiconducting material 102, which is doped with aluminum (Al) and Ga. The Al dopant defines the energy band $E_1$ (about 0.27 eV from the valence band $E_V$), and the Ga dopant defines the energy band $E_2$ (about 0.29 eV from the valence band $E_V$). This means that $\Delta E$ is about 20 meV, which corresponds to a frequency of about 5 THz. In other embodiments, the SiC is doped with boron (B) and Ga. In those embodiments, the B dopant defines the energy band $E_1$ (about 0.29 eV from the valence band $E_V$), and the Ga dopant defines the energy band $E_2$ (about 0.30 eV from the valence band $E_V$). Accordingly, in embodiments where the sensor 100 includes SiC doped with B and Ga, the $\Delta E$ is about 10 meV, which corresponds to a frequency of about 2.5 THz.

Figure 6B:
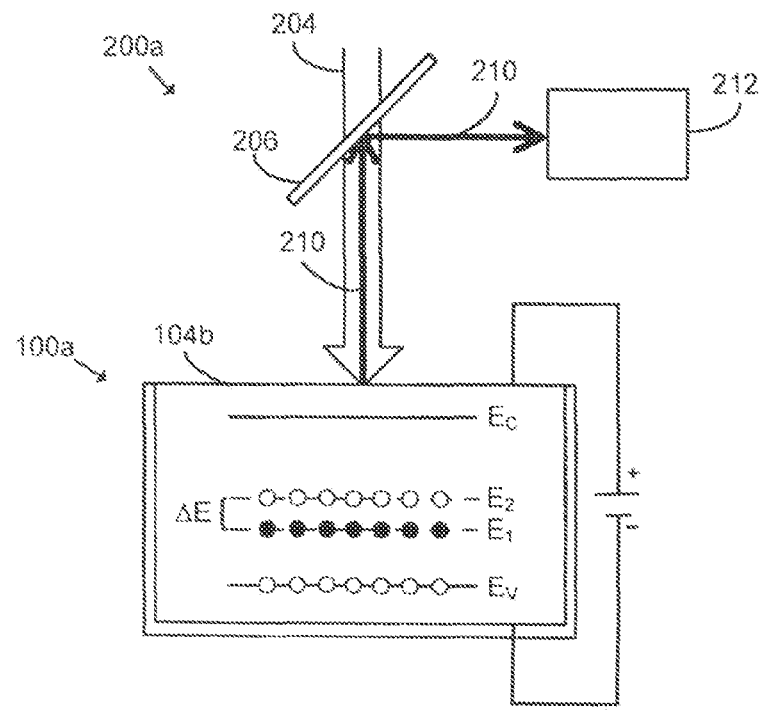

Moving now to FIG. 6B, shown is another block diagram illustrating the example of the system 200a shown in FIG. 6A including the sensor 100a. In FIG. 6B, the photodetector 104b in the sensor 100a is biased such that at least some of the electrons are promoted from the valence band $E_V$ to the energy band $E_1$. The biasing increases the reflectivity of the photodetector 104b, causing the intensity of the reflected laser beam 210 to increase.

Figure 6C:
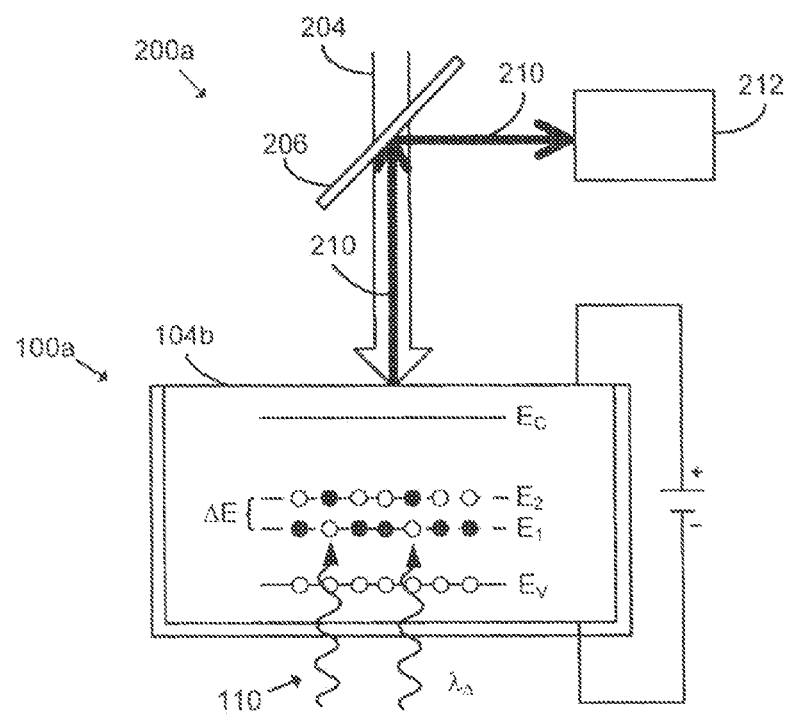

FIG. 6C is still another block diagram illustrating the example of the system 200a shown in FIG. 6A including the sensor 100a. In FIG. 6C, the photodetector 104b in the sensor 100a is biased as shown in FIG. 6B, and photons 110 having a wavelength $\lambda_A$ that corresponds to the energy difference $\Delta E$ are incident upon the photodetector 104b. The photodetector 104b absorbs the photons 110, which causes electrons to be promoted from energy band $E_1$ to energy band $E_2$. This promotion causes the reflectivity of the photodetector 104b to increase further and, thus, increase the intensity of the reflected laser beam 210 further. Accordingly, the sensors 100a described in FIGS. 6A-6C are capable of detecting photons 110 having frequencies of about 2.5 or 5 THz, depending on the selection of dopants.

Figure 7:
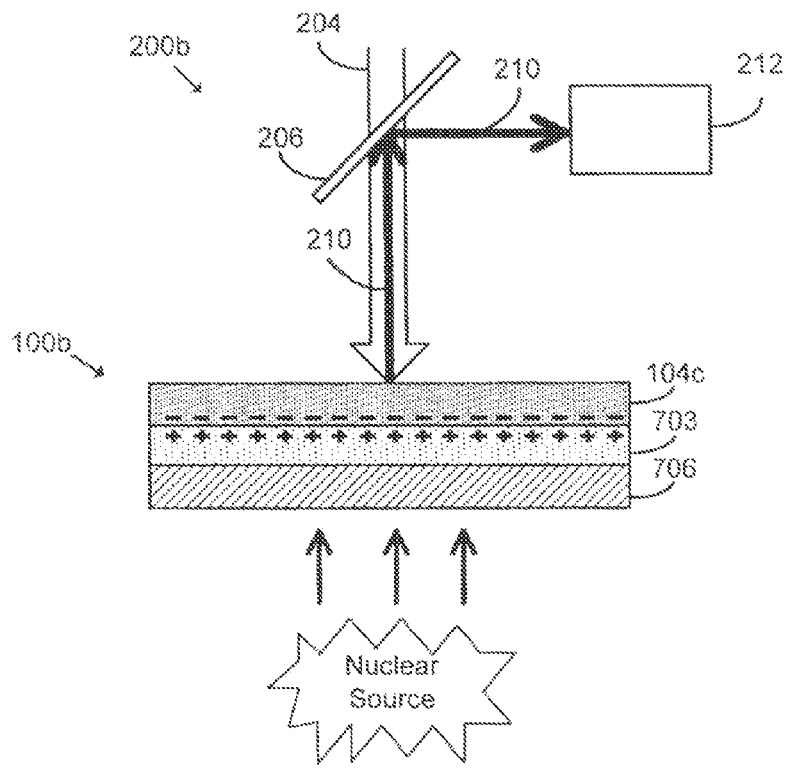
FIG. 7 is a block diagram illustrating another embodiment of a system for measuring the reflectivity of a sensor.

FIG. 7 is a block diagram illustrating another embodiment, among others, of a system 200 for measuring the reflectivity of a sensor 100. Specifically, the system 200, denoted herein as 200b, is for measuring the reflectivity of the photodetector 104 included within a sensor 100, denoted herein as 100b. The sensor 100b is sensitive to incident particles or radiation from a nuclear source, and the reflectivity of the photodetector 104 included within the sensor 100b changes responsive to the incident particles or radiation.

The sensor 100b includes a photodetector 104, an attenuator layer 706, and a converter layer 703 therebetween. The photodetector 104 includes a layer of p-type SiC, and the converter layer 703 includes an n-type wide bandgap material having a high capture cross section for nuclear particles or radiation. The attenuator layer 706 slows down the incident particles or radiation.

The converter layer 703 is so chosen that its capture cross section is very high for the particles and/or radiation to be detected. Since the capture cross section is generally very high for thermal neutrons or low energy γ rays, the attenuator layer 706 would be unnecessary for detecting such low energy particles or radiations. To achieve high sensitivity of the detector for detecting fast neutrons or high energy γ rays, the attenuator layer 706 would be necessary to slow down the incident particles and/or radiations so that they can be absorbed by the converter layer 703 with high capture cross section.

To detect neutrons or γ rays selectively, an absorber layer can be deposited on the attenuator layer 706. This selectivity can be achieved by considering an absorber layer, which preferentially captures or attenuates neutrons or γ rays, and by designing the thickness of the absorber layer appropriately. The absorber layer will act as a nuclear filter. For example, an absorber layer of zirconium dioxide ($ZrO_2$) or tungsten oxide ($W_2O_3$) will filter out the γ rays, while passing the neutrons to the attenuator layer 706. Similarly, an absorber layer of boron carbide (BC), boron nitride (BN) or gadolinium carbide (GdC) will filter out neutrons, while passing the γ rays to the attenuator layer 706. In contrast to this selective detection approach, two lasers of different wavelengths can be used to measure the reflectivity of the photodetector 104 at these two wavelengths and then decouple the signals to detect neutrons and γ rays simultaneously.

The photodetector 104 (e.g., p-type SiC) and converter layer 703 (e.g., n-type region) produce a p-n junction diode with a built-in electric field and distributions of electrons and holes in the depletion layer as shown in FIG. 7, for example. This p-n junction interface provides a controlled location where the charged particles produced by neutrons and γ rays will interact with the electrons and holes and, consequently, modify the densities of the electrons and holes in various energy levels. The optical property, particularly the reflectivity of the interface, can be related to the number density of charged particles at the interface, which in turn can be related to the neutron flux or the intensity of the γ rays incident on the converter layer 703 or the attenuator layer 706 or the absorber layer. Thus, a change in the interfacial reflectivity provides an optical detection mechanism.

Brand et al. investigated Gd-rich oxide/Si heterojunction diodes to detect neutrons by considering the fact that the charged particles produced by neutrons generate electrical signals in the diode. (See J. Brand, M. Natta, P. Jeppson, S. Balkir, N. Schemm, K. Osberg, D. Schultz, J. C. Petrosky, J. W. McClory, J. Tang, W. Wang and P. A. Dowben, Gadolinium rich oxide/silicon heterojunction diodes for solid state neutron detection, World Journal of Engineering, 2009, Vol. 6 (Supplement), pp. 91-92.) The sensor 100b described herein uses silicon carbide instead of Si because SiC is highly resistant (rad hard) to radiation damage. Also, the optical detection mechanism of sensor 100b provides a wireless, remote sensing capability. Additionally the converter layer 703, attenuator layer 706, and absorber layers may each include ceramics, such as oxides, carbides and nitrides, which are high temperature materials. SiC is a wide bandgap semiconductor with bandgap energy (3.26 eV for 4H—SiC) much higher than those of the conventional Si (1.12 eV) and Ge (0.67 eV) semiconductors. Therefore the sensor 100b described herein is suitable for high temperature applications compared to conventional semiconductor-based detectors.

The choice of materials for fabricating a sensor 100b depends on the energy of the nuclear particles or radiations to be detected and how the nuclear particles or radiations interact with the material to form charged particles. P-type SiC substrates can be fabricated by doping SiC with aluminum, while $Gd_2O_3$ intrinsically exhibits n-type characteristics due to oxygen vacancies.

In some embodiments, the sensor 100b is designed to detect neutrons. A material of high neutron capture cross section is included in the sensor 100b for detecting both slow and fast neutrons. The mechanism involves both the scattering and ionizing effects of neutrons in the case of detecting fast neutrons. Gadolinium has an isotope $^{157}Gd$ with thermal neutron capture cross section 255000 barns, which is much higher than the cross sections of 3840 barns for $^{10}B$ and 940 barns for $^{6}Li$. The natural abundances of $^{157}Gd$, $^{10}B$ and $^{6}Li$ are 15.7, 19.8 and 7.4 at. % respectively. The thermal neutron capture cross section of natural Gd is 46000 barns, which is also significantly high. It should be noted that the neutron capture cross sections of these isotopes decrease to very low values when the neutron energy increases. The neutron capture cross section of Gd is, however, known to be significant up to about 200 MeV.

For detecting fast neutrons, the attenuator layer 706 can be a graded structure or a multilayered heterogeneous structure consisting of $Gd_2O_{3(1-x)}C_{2x}$ with x increasing from about 0 at the p-n junction interface to about 1 at the free surface of the attenuator layer 706. When a flux of fast neutrons is incident on the free surface of the attenuator layer 706, the carbon atoms will reduce the energy of neutrons through elastic and inelastic scattering, resulting in the arrival of slow neutrons at the converter layer 703. Therefore the high cross section of Gd will be utilized to capture these slow neutrons, resulting in high sensitivity of the sensor 100b.

In some embodiments, the sensor 100b is designed to detect γ rays. γ rays interact with materials through three mechanisms: photoelectric effect, Compton scattering, and pair production. In the photoelectric effect, which occurs for the γ ray energies up to about 200 keV, the γ photon transfers all of its energy to an atomic electron with interaction cross section proportional to $NZ^5$, where N and Z are the number of atoms per unit volume and the effective atomic number of the material respectively. In the Compton effect, which occurs for the γ ray energies up to a few MeV, the γ photon transfers a fraction of its energy to an outer electron with interaction cross section proportional to NZ, resulting in a hot (high energy) electron and a photon of energy lower than that of the incident γ photon. The pair production, which occurs for γ ray energies above 1.02 MeV, involves interactions between the γ photon and the Coulomb field of the nucleus with interaction cross section proportional to $NZ^2$, resulting in the production of an electron and a positron.

Due to the large influence of atomic number on the interaction cross section, the converter layer 703 can be constructed using a rad hard material of high atomic number, such as $ZrO_2$, for γ ray detection. Since the neutron capture cross section of Zr is very low, the $ZrO_2$ converter layer is not expected to produce significant signals for neutrons, instead it will yield signals for γ rays.

Possible applications of the sensor 100b and/or the system 200b include the control and monitoring of nuclear reactors and fuel processing, characterization of nuclear fuel rods and detection of concealed fissile and radioactive materials.

Having generally described the structure, materials, and mechanisms of various embodiments of a sensor 100, various figures of merit gathered from experimental results will be discussed in the following paragraphs. Specifically, experimental results have been collected for a sensor 100 including an intrinsic semiconducting material 102 of SiC having a region doped with Ga to form a photodetector 104. Among the various figures of merit are detectivity (D*) and noise equivalent temperature difference (NETD), which can be calculated based at least in part on the power of the reflected laser beam 210. D* is a measurement of the sensitivity (S) of an active area of 1 $cm^2$ of the photodetector at a 1 Hz noise-equivalent bandwidth. For conventional electrical photodetectors, the S is a voltage (or current) produced by the electrical photodetector per watt of incident energy [V/W]. For a wireless optical photodetector, such as the photodetector 104, the S is a change in reflectance of the wireless optical photodetector per watt of incident energy $[W^{-1}]$.

Figure 8:
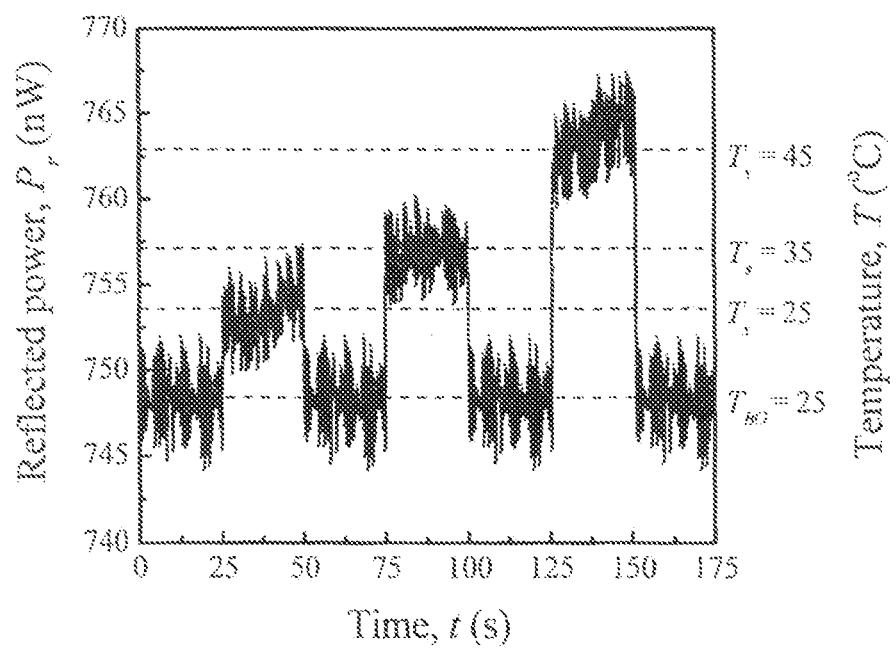
FIG. 8 is a graph illustrating an example of the power of a laser beam reflected by an embodiment of the sensor versus time.

FIG. 8 is a graph illustrating an example of the power of the reflected laser beam 210 (e.g., a He—Ne laser beam) reflected by an embodiment of the photodetector 104 versus time. The power of reflected laser beam 210 is measured by the power meter 212 in the system 200a illustrated in FIG. 2. As discussed above, the power of the reflected laser beam 210 is a function of the modulation of the index of refraction of the photodetector 104 caused by absorbed photons 110. The graph also illustrates the reflected power various temperatures of the source, and the temperatures are useful in determining NETD. $T_{BG}$ is the background temperature of other materials surrounding the source, and in this study, $T_{BG}$ is 25° C., and the reflected power is lower than that of the source due to the difference in emissivity. NETD can be determined from the experimental data of statistical consideration using as shown in Equation (1):

$$NETD = \frac{\sigma_n}{SITF} \quad (1)$$

where $\sigma_n$ is the standard deviation of the detector signal and SITF is the system intensity transfer function. SITF is calculated as shown in Equation (2):

$$SITF = \frac{\overline{P}_2 - \overline{P}_1}{T_2 - T_1} \quad (2)$$

where $P_1$ and $P_2$ are the powers of the reflected laser beam 210 (i.e., the reflected power of He—Ne beam) measured at different times for the source temperatures of $T_1$ and $T_2$, respectively. Further, the detectivity of the sensor 100 can be calculated by the equation bellow.

$$D^* = \frac{(S/N)}{\rho_{d,l}^* I_{i,l}^*} \sqrt{\frac{\Delta f}{A_{Si}}} \quad (3)$$

where S/N is the signal-to-noise ratio of the photodetector 104; $\Delta f$ is the bandwidth of the output circuit [Hz]; $I^*_{i,l}$ is the irradiance of the reflected laser beam 210 incident on the photodetector 104 in the presence of MWIR source [$W/cm^2$]; and $A_{Si}$ is the effective area of the photodetector 104 [cm²]. For the photodetector 104, I*$_{i,l}$ is calculated to be 26.786 nW/mm² and A$_{Si}$ is calculated to be 1.131 mm².

Based on the measurements taken at T$_{BG}$ equal to 25° C., the noise (N) of the signal, which is the standard deviation of the fluctuations in electrical output of the He—Ne beam detector, the signal-to-noise ratio (S/N) is calculated based on N=1.778×10$^{-9}$. S/N=P$_{signal}$/P$_{noise}$=423.51 and Δf=2.5×10⁵ Hz for a photodetector (He—Ne beam detector) and power meter system (e.g., Newport photodetector of model No. 818-SL equipped with 842-PE power meter).

For calculating detectivity of photons 110 in the MWIR range, the parameter, ρ*$_{d,l}$, which is the reflectance of the photodetector 104 for the He—Ne laser wavelength in the presence of MWIR irradiance, is 0.28. This produces a theoretical result of detectivity for the photodetector system consisting of photodetector 104 made of Ga-doped SiC and the He—Ne beam detector and power meter system of Δf=2.5×10⁵ Hz.

$$D^* = \frac{(423.51)\sqrt{2.5 \times 10^5 \text{ Hz}}}{(0.28)(2.679 \times 10^{-6} \text{ W/cm}^2)\sqrt{(1.131 \times 10^{-2} \text{ cm}^2)}} = \quad (4)$$

$$2.7 \times 10^{12} \text{ cm}\sqrt{\text{Hz}}/\text{W}$$

Accordingly, the photodetector 104 including Ga doped SiC has a theoretical detectivity of D*=2.857×10¹² cm √Hz/W and NETD of 39 mK. However, the experimental NETD is 396 mK for certain embodiments of the photodetector 104, specifically, for the photodetector system consisting of photodetector 104 made of Ga-doped SiC, and the He—Ne beam detector and power meter system of Δf=50 Hz, and a lens system that collects more MWIR photons from the field of view and then focuses the collected photons onto the photodetector 104 with increased intensity. Additional sensitivity can be obtained by growing nanostructures on the photodetector 104. Nanostructures have been shown to increase the surface area of materials enhancing the interaction with light. Note in a sensor 100 having an array of photodetectors 104, the absolute surface area will vary from photodetector 104 to photodetector 104, if nanostructures are included. This means that the absolute sensitivity and signal will vary from photodetector 104 to photodetector 104. This variation may be addressed by a process that is standard within the infra red imaging and detection technology of normalization. Normalization of an array of a photodetectors 104 is accomplished by uniformly illuminating the array measuring the response of each photodetectors 104. The lowest performing photodetectors 104 becomes the standard by which the other photodetectors 104 in the array are referenced. The brighter or more sensitive photodetectors 104 have their signal subtracted via a microprocessor-controlled algorithm. This diminishes the overall array sensitivity but enables a uniform response for the output array for detection and quantitative analysis. Different dopants enable the photodetectors 104 to sense different frequencies of light.

The experimental results indicate that, in some embodiments, the photodetector 104a has an NETD of 339 mK. Traditional infrared detectors reach NETD of about 10 mK, but traditional infrared detectors also typically have integrated circuit amplifiers or gain elements on the same microchip as the detector to provide several orders of magnitude of amplification of the signal before being transmitted. In contrast, various embodiments of the sensor 100 described in this application do not require active elements. Hence, the sensor 100 in those embodiments does not suffer from problems such as thermal run away, which can cause a detector to be inoperative in harsh environments. Moreover, in embodiments where batteries are not necessary, the sensor 100 can operate for an indefinite period of time.

Figure 9:
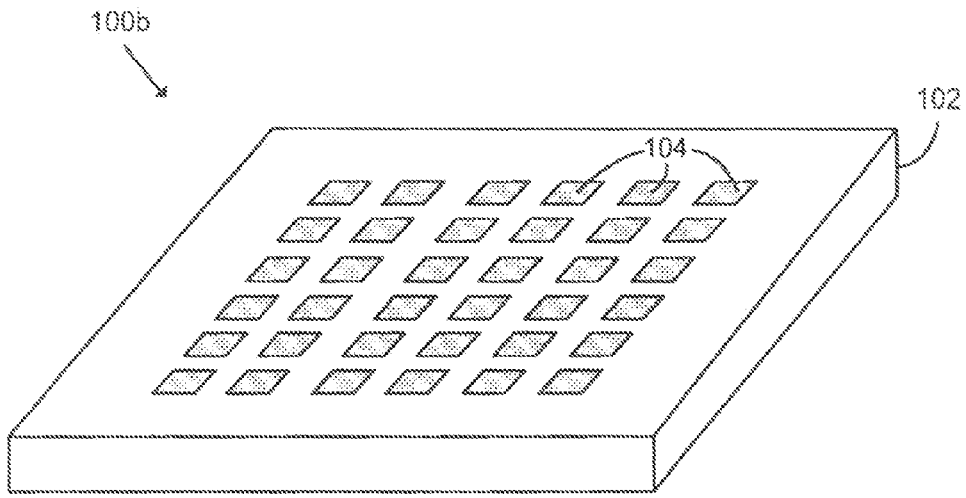
FIGS. 9-11, 13-14, and 15A-15B are perspective views of various other embodiments of a sensor

FIG. 9 is a block diagram illustrating another embodiment, among others, of a sensor 100, denoted herein as 100b. In this embodiment, the sensor 100b includes an array of photodetectors 104 (e.g., pixels). The array configuration enables the sensor 100b to detect photons 110 in various positions across the sensor 100b, and an image associated with the detected photons 110 in the various positions may be formed. As briefly mentioned above, the array of photodetectors 104 are formed by doping a wafer of an intrinsic semiconducting material 102 according to pattern defined by a mask to form an array of photodetectors 104. In the embodiment illustrated, the photodetectors 104 are spaced such that the intrinsic semiconducting material 102 borders each photodetector 104, which reduces the diffusion of electrons between neighboring photodetectors 104. Diffusion of electrons between photodetectors 104 can degrade the integrity of the signals provided by the photodetectors 104.

Other structural features may be incorporated into a sensor 100 to reduce diffusion of electrons between neighboring photodetectors 104. For example, in some embodiments, an electrically insulating material such as silicon dioxide may be positioned between a photodetector 104 and a neighboring photodetector 104 to reduce diffusion therebetween. As another example, a via trench may be etched between at least one of the photodetectors 104 and a neighboring photodetector 104 to provide air as the insulator. In some embodiments, the electrically insulating material, metal, or via trenches may surround the perimeter of a photodetector 104 to prevent diffusion of electrons between photodetectors 104. In some embodiments, the intrinsic semiconducting material 102 between neighboring photodetectors 104 may be processed with a chemical that reduces the diffusion of electrons between photodetectors 104.

Figure 10:
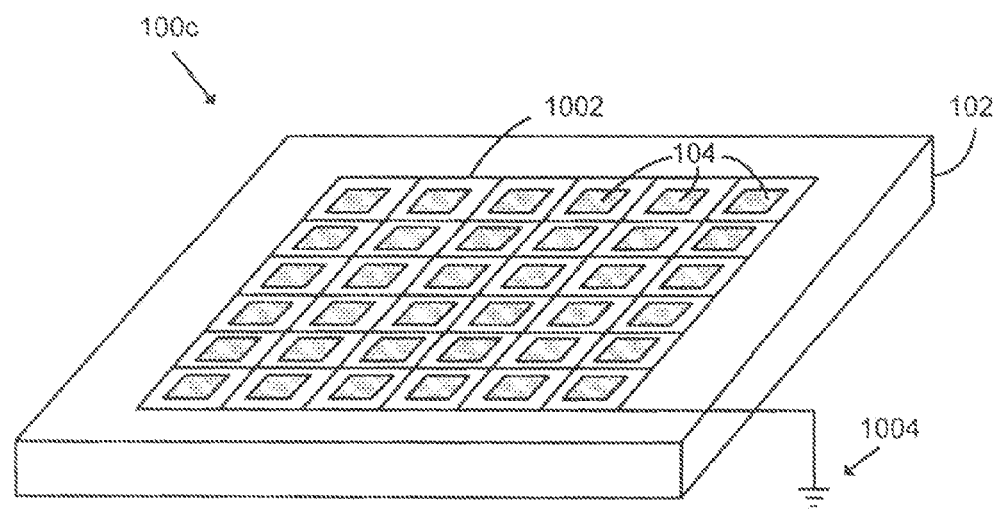

FIG. 10 illustrates another embodiment of a sensor 100, denoted herein as 100c. The sensor 100c includes an array of photodetectors 104 and a metal grid 1002 positioned between the photodetectors 104 that is connected to ground 1004 to route electrons that diffuse between the photodetectors 104 to ground 1004. In other embodiments, a metal barrier connected to ground 1004 may be positioned between at least some of the photodetectors 104 in another configuration.

Figure 11:
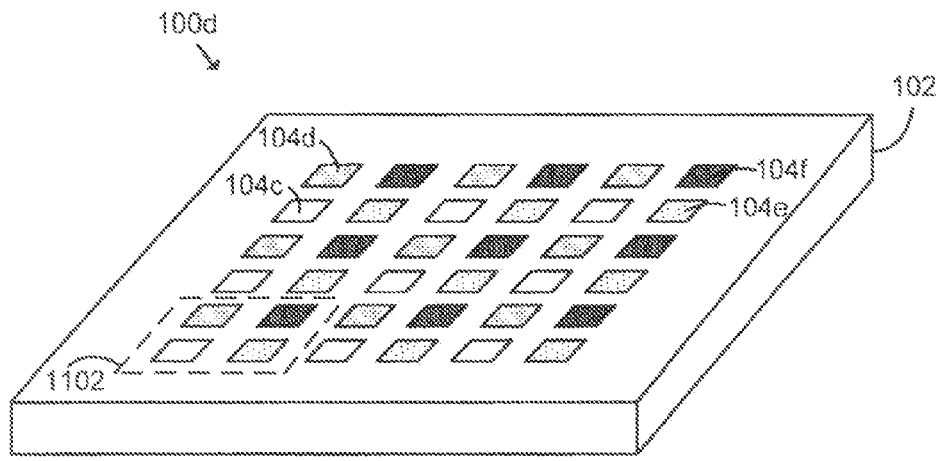

FIG. 11 illustrates still another embodiment of a sensor 100, denoted herein as 100d. In FIG. 11, the sensor 100d includes an array of various examples of photodetectors 104, denoted herein as 104c, 104d, 104e, and 104f. Each of the photodetectors 104c, 104d, 104e, and 104f may be doped such that the photodetectors 104c, 104d, 104e, and 104f are responsive to photons 110 having different wavelengths. In this example, the various photodetectors 104 are grouped in groups 1102 of four photodetectors 104, which forms an array of groups 1102 of photodetectors 104. In other embodiments, the various photodetectors 104 may be grouped in a different manner, and each group 1102 may include more or less than four different photodetectors 104.

Figure 12:
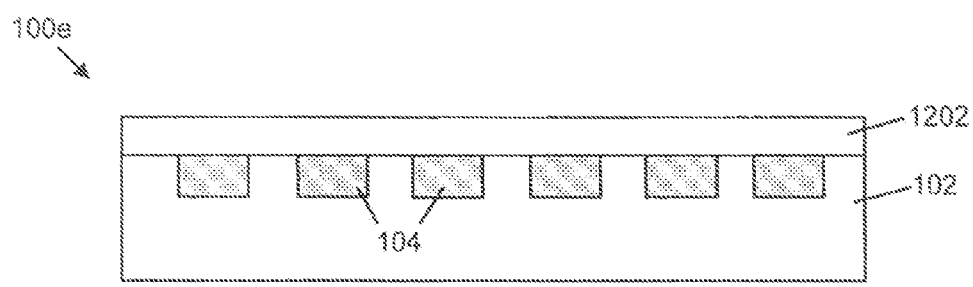
FIG. 12 is a cross-sectional view of a further embodiment of a sensor.

FIG. 12 is a cross-sectional view of a further embodiment of a sensor 100, denoted herein as 100e. The sensor 100e is similar to the sensor 100b illustrated in FIG. 9 in that the sensor 100e includes an array of photodetectors 104. The sensor 100e further includes an optically-transparent conductive film 1202 that covers the top of each photodetector

104. A direct current (DC) voltage may be applied to the optically-transparent conductive film 1202 to sweep away the free photogenerated carriers, which enhances the lifetime of the photogenerated carriers, and hence the reflectivity of the modulated signal.

In some embodiments, less than the entire top surface of each photodetector 104 may be covered by the optically-transparent conductive film 1202. Also, in some embodiments, at least a portion of the intrinsic semiconducting material 102 may be covered by the optically-transparent conductive film 1202 as well. The optically-transparent conductive film 1202 may include a material that is transparent in the mid infrared range, such as Indium Tin Oxide (ITO), and the optically-transparent conductive film 1202 may be deposited by a DC or RF sputtering system at pressures on the order of μTorr at a deposition rate of 10 Å/minute. An additional thermal treatment in air may also be applied to enhance the conductivity and transparency of the optically-transparent conductive film 1202. For ITO, a typical thermal anneal is 400° C. for about 30 minutes.

Figure 13:
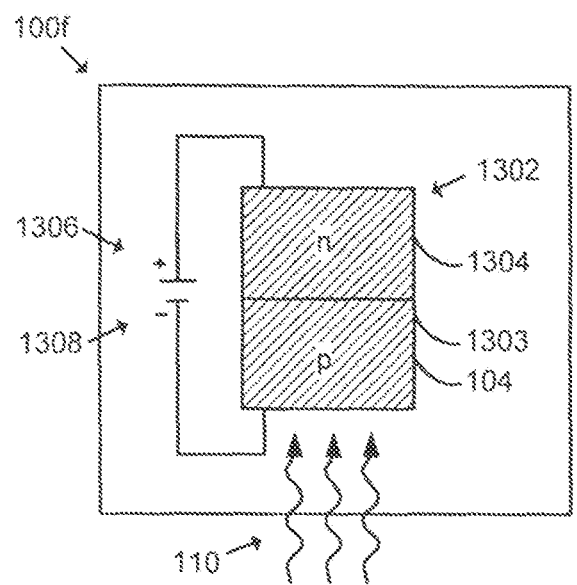

FIG. 13 is a block diagram illustrating another embodiment of a sensor 100, denoted herein as 100*f*. The sensor 100*f* includes an avalanche photodiode 1302 that includes an n-type region 1304 and a p-type region 1303 forms photodetector 104. In other embodiments, avalanche photodiode 1302 may include a p-type region 1303, and the n-type region 1304 may form the photodetector 104. An external electric field is applied across the avalanche photodiode 1302. In some embodiments, a sensor 100 may include an array of avalanche photodiodes 1302, each including a photodetector 104 and being biased by an external electric field.

The external electric field removes photoexcited electrons from the acceptor band $E_a$ (i.e., dopant energy level) in the photodetector 104 and accelerates the photoexcited electrons toward the cathode 1306. This causes some of the photogenerated electrons to jump back to the valence band $E_V$ and recombine with holes. This generation-recombination process establishes an equilibrium electron population density in the acceptor band $E_a$. Removal of electrons from the acceptor band $E_a$ by the external electric field creates a nonequilibrium mechanism to produce vacant sites for electrons in the acceptor band $E_a$ in the photodetector 104, enabling the incident photons 110 to generate more photoexcited electrons. This nonequilibrium mechanism can increase the quantum efficiency of the sensor 100*f*.

Also, the external electric field causes the accelerated electrons to collide with other electrons to produce hot electrons (i.e., highly energetic free electrons). These hot electrons also collide with other electrons and produce more hot electrons, leading to an avalanche of electrons. Therefore, the free electron density will increase in the photodetector 104, causing a large change in the reflectivity of the sensor 100*f*. This large change in reflectivity enables the photodetector 104 to detect of a weak signal (very few photons) from a target. In some embodiments, the sensor 103 may be included in another electronic device, such as a transistor.

Figure 14:
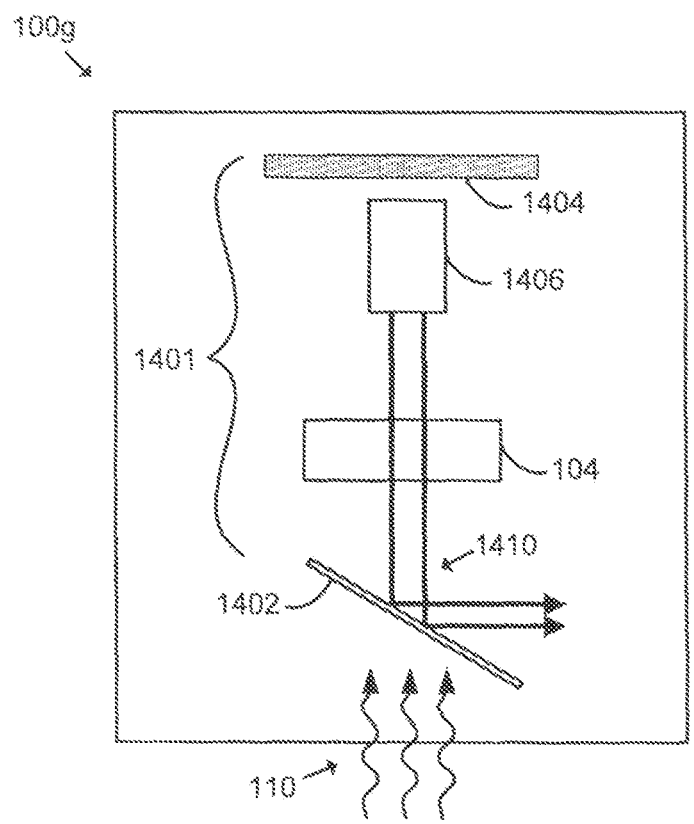

FIG. 14 is a block diagram illustrating an example of a sensor 100*g* that includes a laser resonator 1401. The laser resonator 1401 includes a fully reflective mirror 1404, a lasing medium 1406, and a photodetector 104 that functions as a mirror having a variable reflectivity. The dichroic mirror 1402 is positioned in front of the photodetector 104, and the dichroic mirror 1402 allows photons 110 to pass through the dichroic mirror 1402 to the photodetector 104. However, the dichroic mirror 1402 fully reflects the laser beam coming out of the laser resonator 1401. The photoexcited electrons modify the electron density in the photodetector 104, which changes the refractive index and, consequently, the reflectivity of the photodetector 104. This change in reflectivity modifies the intensity of the laser beam 1410 leaving the laser resonator 1401. By this mechanism, the sensor 100*g* can detect a very weak signal (e.g., very few photons 110) and obtain a strong optical (e.g., laser) signal based on the photodetector 104 response. The optical signal can be used to produce images in flat panel displays or on another screen.

In some embodiments, the photodetector 104 of the laser resonator 1401 may be included within an avalanche photodiode 1302, such as the avalanche photodiode 1302 illustrated in FIG. 13, and/or another electronic device to enhance the production of electrons in different energy levels in order to cause a large change in reflectivity of the photodetector 104. In those embodiments, the avalanche photodiode 1302 is biased as illustrated in FIG. 13. A large change in the reflectivity of the photodetector 104 causes a greater change in the laser power exiting the laser resonator 1401, and thus, amplifies the signal even further. In some embodiments, the sensor 100*g* may include an array of laser resonators 1401.

Figure 15A:
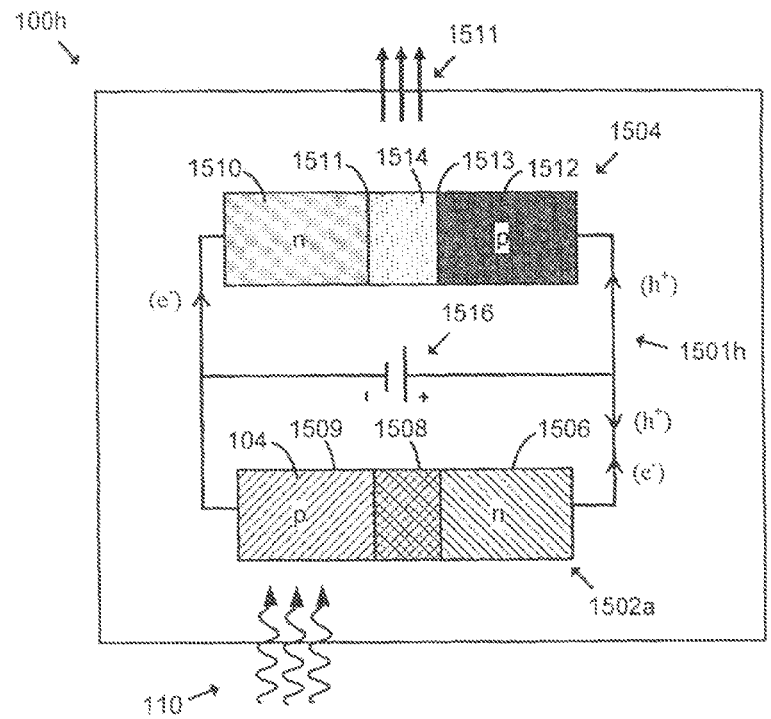
Figure 15B:
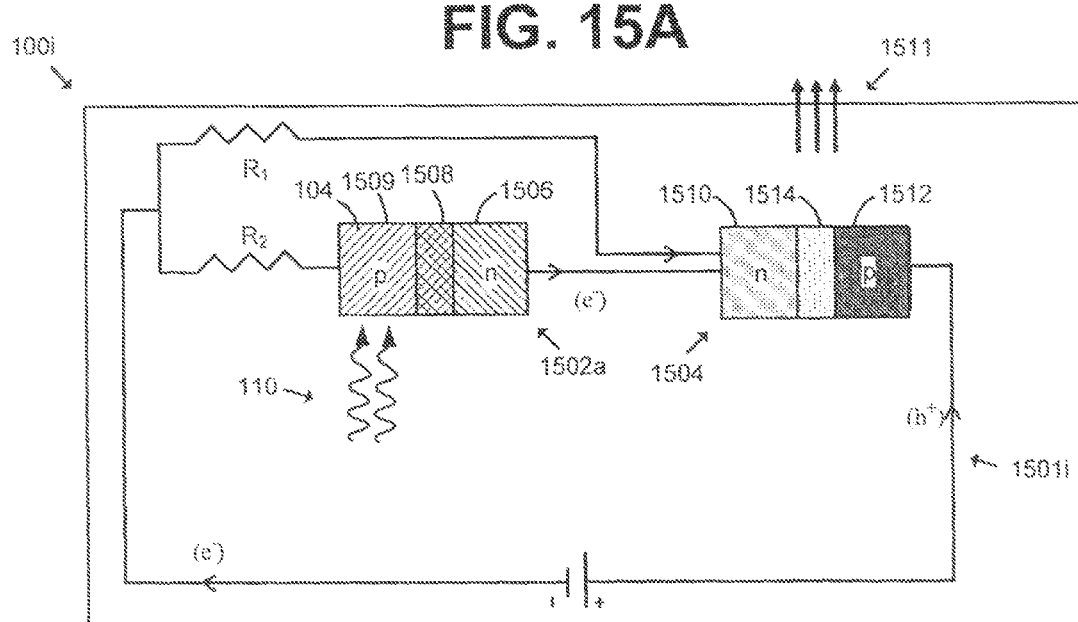

FIGS. 15A-15B are block diagrams illustrating examples of a sensor 100, denoted herein as 100*h* and 100*i*, respectively. The sensors 100*h*, 100*i* each include a circuit 1501, denoted herein as 1501*h* and 1501*i*, respectively, that couple a laser source 1504 to an example of a photodiode 1502 including a photodetector 104, denoted herein as 1502*a*. The photodiode 1502*a* may be a p-n junction diode, PIN diode, or another diode structure.

In the embodiments illustrated, the photodiode 1502*a* includes a p-type doped region 1509 and an n-type region 1506. In some embodiments, such as the ones illustrated in FIGS. 15A-15B, the p-type region 1509 forms the photodetector 104. In other embodiments, the n-type region 1506 forms the photodetector 104. A depletion region 1508 is formed at the junction of the p-type region 1509 and the n-type region 1506 with a built-in electric field across the depletion region 1508. The direction of this built-in electric field is from the interface between the depletion region 1508 and the n-type doped region 1506 to the interface between the depletion region 1508 and the photodetector 104. The photodiode 1502*a* is reverse-biased by a power source shown as a voltage source 1516.

The photoexcited electrons are produced in the photodetector 104, and the photoexcited electrons travel toward the n-type doped region 1506 of the photodiode 1502*a* due to the built-in electric field in the depletion region 1508. These electrons are moved through the electrical circuit 1501 by the external voltage source 1516, establishing photocurrent in the circuit 1501. The creation of photoexcited electrons by the photons 110 effectively reduces the electrical resistance of the photodiode 1502*a*, inducing photocurrent in the circuit 1501. The external voltage source 1516 is also coupled to a laser source 1504 that is forward biased. This laser source 1504 a laser diode, a quantum well device, and/or another laser-producing device, and the laser source 1504 emits a laser beam 1511. The laser source can alternatively be a light-emitting diode (LED).

In the embodiment illustrated in FIG. 15A, the laser source 1504 is coupled in parallel with the photodetector 104 and the external voltage source 1516. However, in the embodiment illustrated in FIG. 15B, the photodetector 104 is connected in series with the laser source 1504 and the external voltage source 1516. In the absence of photoexcitation due to incident photons 110, the resistance of the photodetector 104 is high, which affects the overall resistance of the circuit 1501. When photons 110 are incident on the photodetector 104, the resistance of the photodetector 104 decreases, which changes the overall resistance of the circuit 1501. Consequently, the number of electrons and holes injected into the laser source 1504 by the external voltage source 1516 changes, which modifies the output laser power (i.e., output signal). Accordingly, an optical signal can be produced based on the photodetector 104 response to the incident photons 110 (i.e., input signal), and the optical signal can be used to display images of a target that emitted the photons 110 in a flat panel display or another screen.

In some embodiments, the sensors 100h, 100i include an array of photodiodes 1502a and an array of laser sources 1504. Each photodiode 1502a is coupled to a respective one of the laser sources 1504. In some embodiments, the external voltage source 1516 is an AC voltage source is instead of a DC voltage source. In those embodiments, the AC voltage source is used to create a pulsed photocurrent and a pulsed laser beam 1511 (i.e., a pulsed optical signal output). For a small amount of energy per pulse, the intensity of the laser beam 1511 is very high which enables amplification of weak incident signals. Resistors (e.g., $R_1$, $R_2$), capacitors, and inductors can be used in the circuits 1501h, 1501i to create an oscillation frequency for absorbing more of the incident photons 110 by the photodiode 1502a.

Figure 16:
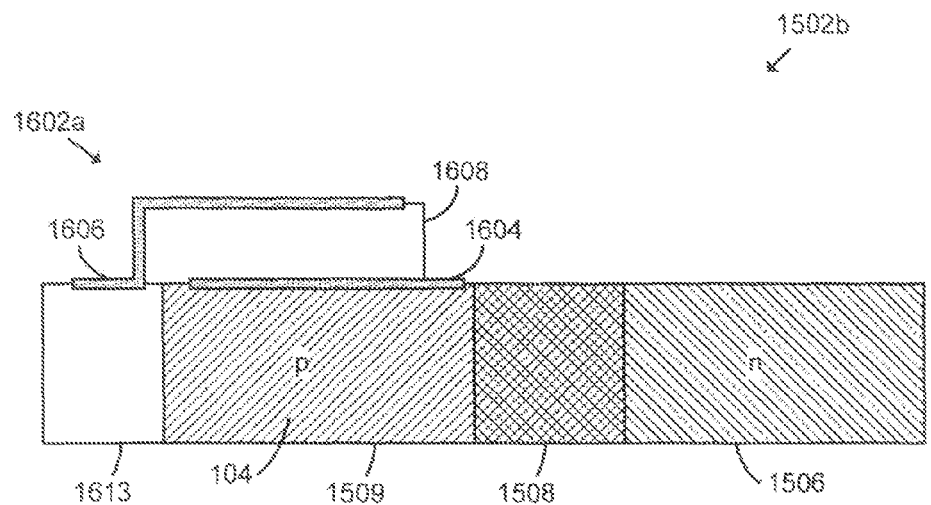
FIG. 16 is a cross-sectional view of an example of a photodiode including a capacitor.

FIG. 16 is a cross-sectional view of another example of a photodiode 1502, denoted herein as 1502b, further including a capacitor 1602. For example, in FIG. 16, an example of a capacitor 1602, denoted 1602a, is formed on the photodetector 104 of the photodiode 1502. The capacitor 1602a includes a first metal layer 1604 and a second metal layer 1606 having an insulating layer 1608 (e.g., silicon dioxide) therebetween. The first metal layer 1604 is deposited on the photodetector 104, and the insulating layer 1608 is deposited on the first metal layer 1604. The insulating layer 1608 may be deposited by a plasma-enhanced chemical vapor deposition (PECVD), sputtering, or another deposition process. In some embodiments, the insulating layer 1608 is at least about 500 Å thick. The second metal layer 1606 is deposited on the insulating layer 1608 and an additional insulating layer 1613 that abuts the photodetector 104. The photoexcited electrons can be stored in this capacitor 1602a. Accordingly, the electron density in selected regions of the photodiode 1502 may be modified depending on the locations of the capacitor 1602a in the photodiode 1502. Therefore, the refractive index of the photodetector 104 can be changed selectively based on the electron storage capability of the capacitor 1602a, which will increase the sensitivity of the photodetector 104. In other embodiments, a plurality of capacitors 1602 may be fabricated in the photodiode 1502.

Figure 17:
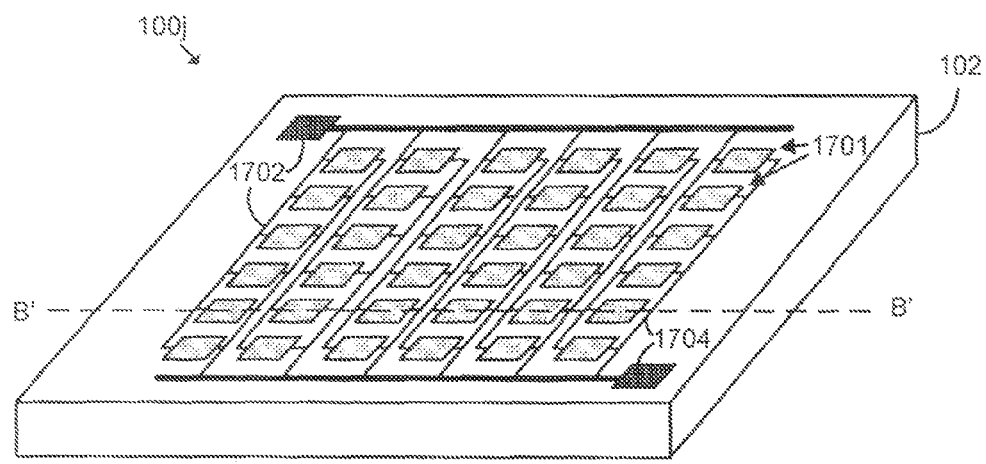
FIG. 17 is a perspective view of an embodiment of a sensor including a plurality of vertical-cavity surface-emitting lasers (VCSELs).

FIG. 17 illustrates another embodiment of a sensor 100, denoted herein as 100j. The sensor 100j includes an array of vertical-cavity surface-emitting lasers (VCSELs) 1701, and each VCSEL includes a photodetector 104. Not only may a VCSEL 1701 increase the gain of a photodetector 104, but the signal-to-noise ratio of the photodetector 104 may be enhanced by including the photodetector 104 within a VCSEL 1701. The sensor 100j further includes an n-side contact 1702 that is coupled to the n-region of each VCSEL 1701 in the array as well as a p-side contact 1704 that is coupled to the p-region of each VCSEL 1701.

Figure 18A:
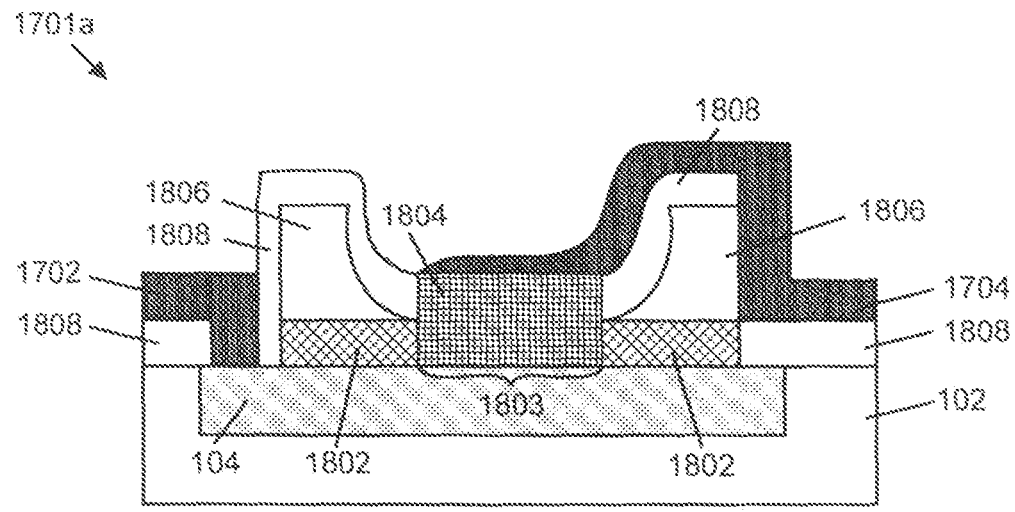
FIG. 18A is a cross-sectional view of an embodiment of one of the VCSELs illustrated in FIG. 17.
Figure 18B:
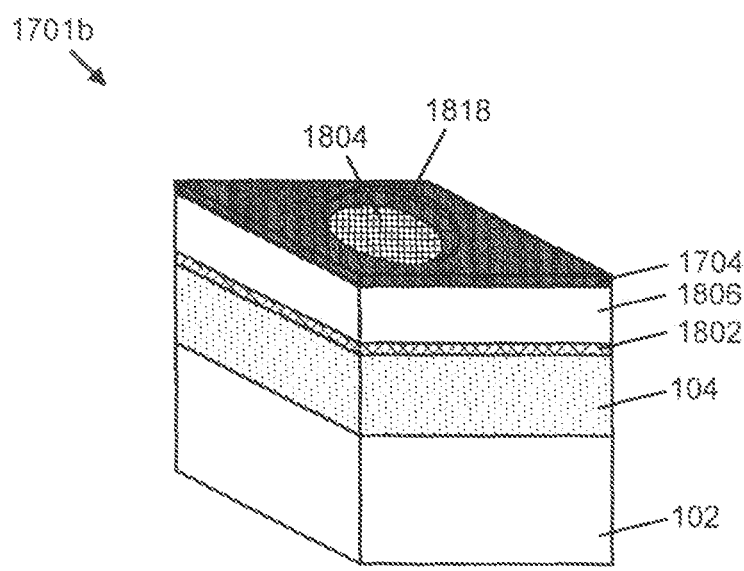
FIG. 18B is a perspective view of another embodiment of one of the VCSELs illustrated in FIG. 17.

FIGS. 18A and 18B each illustrate various embodiments of one of the VCSELs 1701 illustrated in FIG. 17. FIG. 18A illustrates a cross-sectional view through line B' of an example of a VCSEL 1701, denoted herein as 1701a, in the sensor 100j illustrated in FIG. 17. The VCSEL 1701a includes an intrinsic semiconducting material 102, and the intrinsic semiconducting material 102 is n-doped to form a photodetector 104. The photodetector 104 functions as an n-type lower Bragg reflector. A quantum well 1802 is positioned on the photodetector 104, and the quantum well 1802 may include an AlGaN, GaN, InGaN, and/or N epilayer. The quantum well 1802 defines an opening 1803, which includes a p-doped region 1804 that is positioned on the photodetector 104. The p-doped region 1804 functions as p-type upper Bragg reflector.

The n-side contact 1702, which is shown in FIG. 17, is coupled to the photodetector 104. Similarly, the p-side contact 1704, which is also shown in FIG. 17, is coupled to the p-doped region 1804 of the VCSEL 1701. Also, each VCSEL 1701 is coupled in parallel to a power source such as a 3 V power supply. In operation, photons 110 in the mid infrared range are absorbed by the photodetector 104 of a VCSEL 1701, which creates photocarriers in the photodetector 104, changing the carrier density. The change in carrier density alters the reflectivity and the index of refraction of the photodetector 104. Additionally, the change in carrier density alters the resistivity of the photodetector 104.

The combination of change in reflectivity and resistivity modulates the emission of the VCSEL 1701. Further, the absorption of photons 110 effectively changes the overall Q of the laser cavity and modulates the emission of the VCSEL 1701. In some embodiments, an electrical bias may be applied to one or more of the VCSELs 1701. Including an array of VCSELs 1701 in a sensor 100 reduces the temperature range of operation of a photodetector 104 to between 0° C. and 40° C.

An insulating material 1808, such as a SiO2 passivation layer, is deposited on the epilayers 1806 by a plasma-enhanced chemical vapor deposition (PECVD) process. The insulating material 1808 is deposited at a low temperature to prevent inter-diffusion of electrons within the quantum well 1802 of the VCSEL 1701. For example, the PECVD process may be at temperatures as low as 300° C. for two minutes to deposit 2 microns $SiO_2$. The shorter the time and temperature, the less damage will occur to the quantum well 1802. The insulating material 1808 does not cover the p-doped region 1804 and may be etched to provide an opening.

The doping of the photodetector 104 may be accomplished by standard semiconductor processes such as ion implantation, spin-on doping, and/or other forms of doping. The depth of the dopant may be controlled during the ion implantation process and/or through subsequent thermal anneal treatments. The thermal anneal treatments move the dopants from interstitial sites within the material to place the dopant atoms within the lattice. In the lattice, the dopant has a narrow frequency response range. When the dopant is located in an interstitial site of the intrinsic semiconducting material 102, the photodetector 104 will have a broadened frequency response relative to the response within the lattice. In some embodiments, the doping may be accomplished by a laser doping technique instead, which will be described below in connection a laser doping system illustrated in FIG. 18A.

FIG. 18B illustrates a cross-sectional view through line B' of an example of a VCSEL 1701, denoted herein as 1701b, in the sensor 100j illustrated in FIG. 17. The VCSEL 1701b is similar to the VCSEL 1701a illustrated in FIG. 18A in that the quantum well 1802 is positioned on the photodetector 104. However, in the VCSEL 1701b illustrated in FIG. 18A, the p-side contact 1704 covers the insulating layer 1808 and at least a portion of the p-doped region 1804. The p-side contact 1704 further defines an opening 1818 that exposes the p-doped region 1804.

Figure 19:
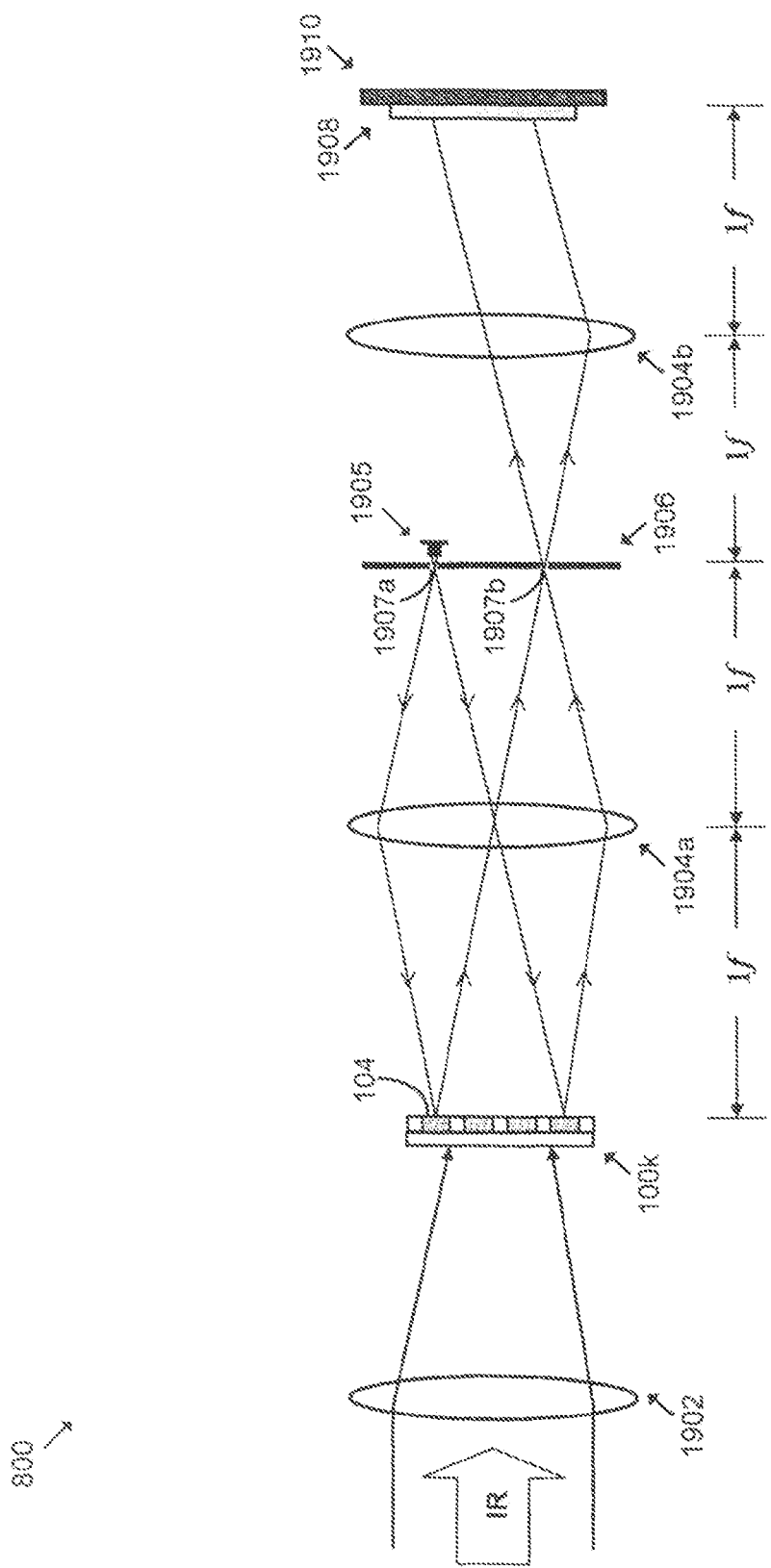
FIG. 19 is a block diagram illustrating an embodiment of a system for optically reading an embodiment of a sensor.

FIG. 19 is a block diagram illustrating an embodiment, among others, of a system 1900 for optically reading an embodiment of a sensor 100, denoted herein as 100k. The system 1900 includes an Mid-Wave Infra-Red (MWIR) lens 1902, the sensor 100k, a first lens 1904 (denoted herein as 1904a), a plate 1906 including at least two pinholes 1907 (denoted herein as 1907a and 1907b), a light emitting diode (LED) 1905, a second lens 1904 (denoted herein as 1904b), and a charge coupled device (CCD) 1908 coupled to a complementary metal oxide semiconductor (CMOS) circuit 1910. The sensor 100k, the first lens 1904a, the plate 1906, the second lens 1904b, and the CCD 1908 are each spaced by 1f, wherein the frequency is associated with the wavelength of the received light as would be understood by a person of skill in the art.

The sensor 100k includes an array of photodetectors 104 that form a focal plane array (FPA). The LED 1905 is useful for acquiring a response from the sensor 100k, and the LED 1905 is positioned to receive light transmitted through one of the pinholes 1907 (e.g., 1907a) from the light that pass through the sensor 100k and are focused by the first lens 1904a. The light that pass through another pinhole 1907 (e.g., 1907b) are received by the second lens 1904b, which transmits the light to the CCD 1908.

For example, light are received and focused by the MWIR lens 1902, which transmits the light to the sensor 100k. The light pass through the sensor 100k to the first lens 1904a, and the first lens 1904a focuses and transmits the light to the pinholes 1907a, 1907b in the plate 1906. The system 1900 can function as an uncooled wideband camera at various wavelengths, such as shortwave infrared (SWIR), midwave infrared (MWIR), and longwave infrared (LWIR) wavelengths.

The sensitivity of the sensor 100k to wavelengths in different ranges can be controlled according to the dopant energy levels of the photodetectors 104. Also, in some embodiments, a sensor 100k including a multiwave band FPA is fabricated by doping the photodetectors 104 with multiple dopants of different energy levels. The multiple responses of the multiwave band FPA can be acquired using a plurality of LEDs 1905 that are sensitive to different wavelengths, the CCD 1908, and signal processing to decouple the signals of the LEDs 1905.

The system 1900 may eliminate a need for a custom readout integrated circuit (ROIC), and the system 1900 can be optimized independently from an ROIC. Additionally, the system 1900 (excluding the CMOS circuit 1910 does not require power. Further, the system 1900 presents no bottleneck to the readout data rate, and the system 1900 is scalable to multi-megapixel resolution. The scalability is merely limited by photolithography.

Figure 20:
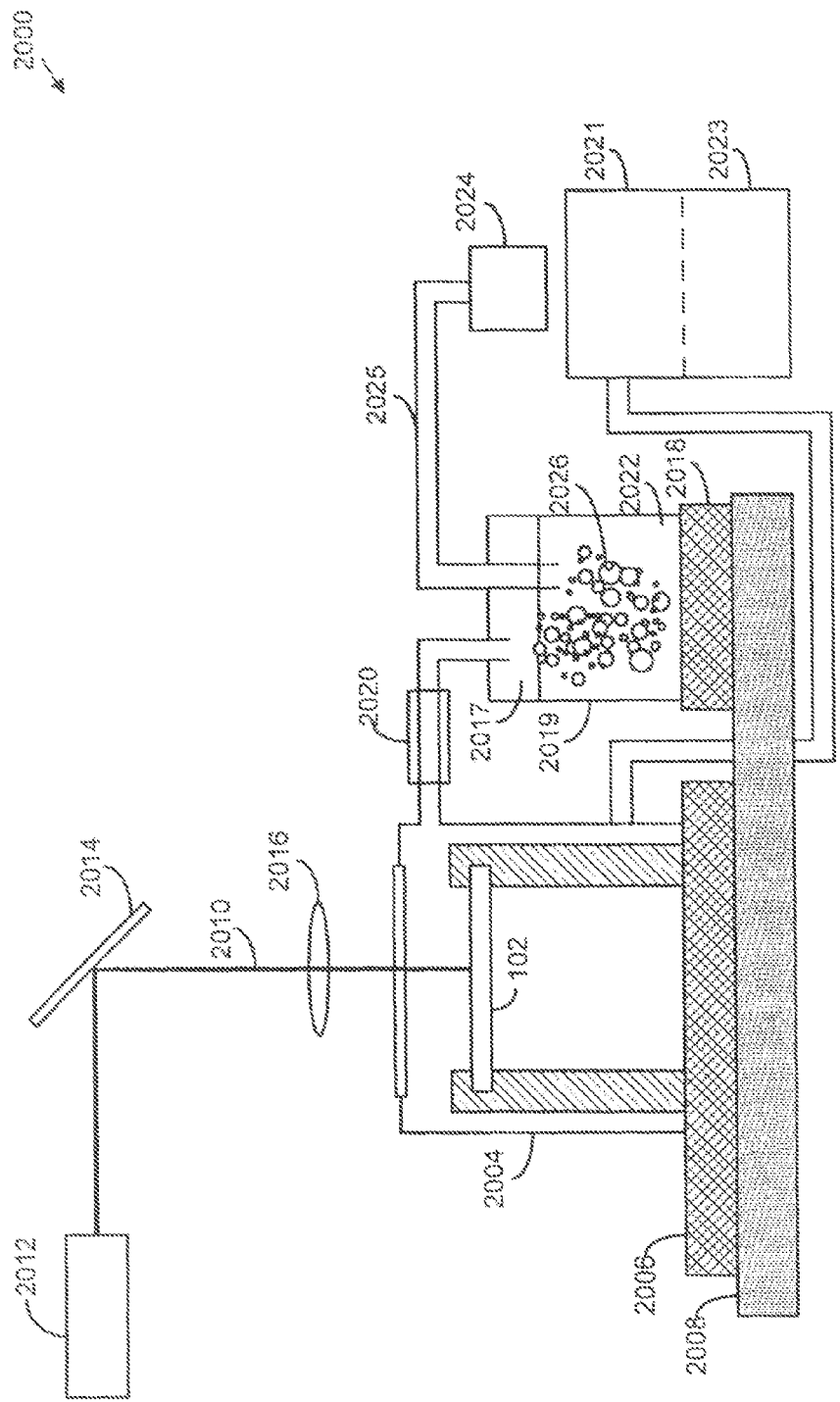
FIG. 20 is a block diagram illustrating an embodiment of a laser doping system.

FIG. 20 is a block diagram illustrating an embodiment of a laser doping system 2000. The laser doping system 2000 may be used to dope an intrinsic semiconducting material 102 to form a photodetector 104. The laser doping system 2000 dopes the intrinsic semiconducting material 102 provided in a processing chamber 2004. The processing chamber 2004 is positioned on a micro stage 2006, which itself is positioned on a linear stage 2008. The micro stage 2006 and the linear stage 2008 are useful for adjusting the position of the intrinsic semiconducting material 102 with respect to the position of a laser beam 2010 emitted by a laser 2012.

In some embodiments, the laser 2012 is, for example, a neodymium-doped yttrium aluminum garnet (Nd: YAG) laser, which emits a laser beam 2010 (i.e., light) having a wavelength of about 1064 nm. The laser beam 2010 may be frequency doubled to generate laser beam 2010 having a wavelength of about 532 nm. In some embodiments, the laser 2012 is an excimer laser including an excimer of, for example, ArF, KrF, or XeF that emits a laser beam 2010 having a wavelength of 193 nm, 248 nm, and 351 nm, respectively.

The laser beam 2010 emitted by the laser 2012 is reflected by a bending mirror 2014 to pass through a lens 2016 onto the intrinsic semiconducting material 102 in the processing chamber 2004. The processing chamber 2004 is mechanically coupled to a bubbler 2018, and a flow meter 2020 controls the communication of gases and/or liquids between the processing chamber 2004 and the bubbler 2018. A diffusion pump 2021 and a mechanical pump 2023 are also mechanically coupled to the processing chamber 2004. In some embodiments, the bubbler 2018 is positioned on the linear stage 2008.

The bubbler 2018 is sized and dimensioned to hold a dopant containing liquid 2022 while providing space for holding air at the top of the bubbler 2018. The bubbler 2018 is positioned on the heater 2019, and the bubbler 2018 is also mechanically coupled to a carrier gas source 2024 by a gas conducting pipe 2025, which is partially submerged in the dopant liquid 2022. The carrier gas provided by the carrier gas source 2024 may be one or more of many inert gases. For example, the carrier gas may include one or more of the following gases: argon, helium, nitrogen, neon, krypton, xenon, and/or radon.

Figure 21:
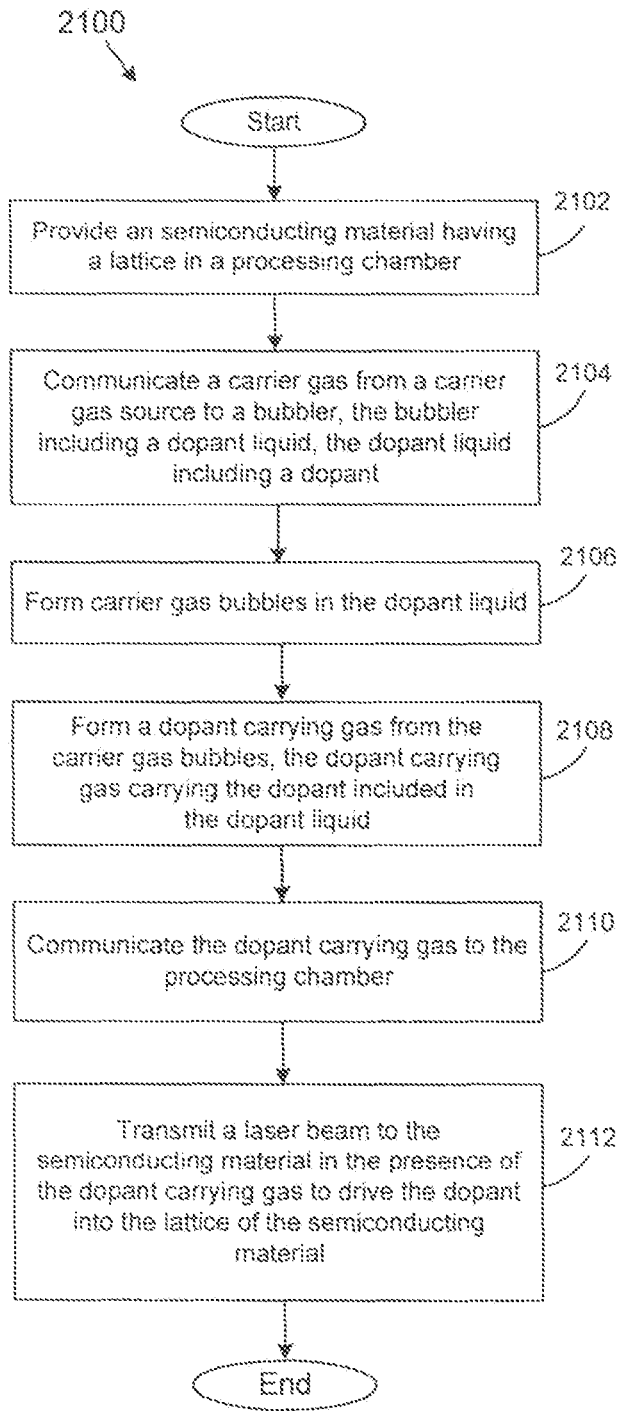
FIG. 21 is a flowchart showing an example of a method of laser doping an intrinsic semiconducting material using the laser doping system of FIG. 20.

FIG. 21 is a flowchart showing an example of a method 2100 of laser doping an intrinsic semiconducting material 102 using the laser doping system 2000. In box 2102, an intrinsic semiconducting material 102 is provided in a processing chamber 2004, and the intrinsic semiconducting material 102 has a lattice. In box 2104, a carrier gas is communicated from a carrier gas source 2024 to a bubbler 2018. The dopant carrying gas 2017 is communicated from the bubbler 2018 to the processing chamber 2004 as permitted by the flow meter 2020. The bubbler 2018 includes a dopant liquid 2022, which includes a dopant.

In box 2106, carrier gas bubbles 2026 are formed in the dopant liquid 2022 in the bubbler 2018, and in box 2108, a dopant carrying gas 2017 is formed from the carrier gas bubbles 2026. The dopant carrying gas 2017 carries the dopant included in the dopant liquid 2022. In box 2110, the dopant carrying gas 2017 is communicated to the processing chamber 2004, which houses the intrinsic semiconducting material 102.

In box 2112, a laser beam 2010 is transmitted to the intrinsic semiconducting material 102, which is in the presence of a dopant carrying gas 2017 in the processing chamber 2004. The laser beam 2010 drives the dopant carried by the dopant carrying gas 2017 into the lattice of the intrinsic semiconducting material 102. The laser beam 2010 heats the intrinsic semiconducting material 102 in the presence of the dopant carrying gas 2017 causing the dopant to thermally diffuse into the intrinsic semiconducting material 102 at the position where the laser beam 2010 heated the intrinsic semiconducting material 102.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include ±1%, ±2%, ±3%, ±4%, ±5%, ±6%, ±7%, ±8%, ±9%, or ±10%, or more of the numerical value(s) being modified. In addition, the phrase "about 'x' to 'y'" includes "about 'x' to about 'y'".

It should be emphasized that the above-described embodiments in this Disclosure are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this Disclosure, and the Disclosure protected by the following claims.

The invention claimed is:

1. A method of optical signal amplification, comprising:
    receiving incident photons at a first surface of a photodetector that includes at least a first doped semiconductor which is biased by a power source, wherein said incident photons are in a wavelength range which generates a change in a reflective property of said first doped semiconductor and
    reflecting a first optical signal off said photodetector to provide a reflected beam, or said photodetector includes a semiconductor junction including said first doped semiconductor and a second doped semiconductor, said semiconductor junction being reverse biased by said power source to provide a reversed biased semiconductor junction that is within a laser resonator including a laser medium, wherein a second optical signal is emitted from said laser resonator.

2. The method of claim 1, further comprising detecting said reflected beam or said second optical signal.

3. The method of claim 1, wherein said first optical signal comprises a laser beam.

4. The method of claim 1, wherein said photodetector is within a vertical-cavity surface-emitting laser (VCSEL).

5. An optical signal amplifying system, comprising:
    a photodetector that includes at least a first doped semiconductor which is biased by a power source, wherein incident photons in a wavelength range which generates a change in a reflective property of said first doped semiconductor are received at said first doped semiconductor and
    a light source aligned to reflect a first optical signal from off said photodetector to provide a reflected beam, or said photodetector includes a semiconductor junction including said first doped semiconductor and a second doped semiconductor, said power source reverse biasing said semiconductor junction to provide a reversed biased semiconductor junction that is within a laser resonator including a laser medium, wherein a second optical signal is emitted from said laser resonator.

6. The system of claim 5, further comprising a detector for detecting said reflected beam or said second optical signal.

7. The system of claim 5, wherein said first optical signal comprises a laser beam from a laser source.

8. The system of claim 5, wherein said photodetector is within a vertical-cavity surface-emitting laser (VCSEL).

* * * * *